United States Patent
Ong

(10) Patent No.: US 9,001,607 B2
(45) Date of Patent: Apr. 7, 2015

(54) METHOD AND DESIGN FOR HIGH PERFORMANCE NON-VOLATILE MEMORY

(75) Inventor: Adrian E. Ong, Pleasanton, CA (US)

(73) Assignee: Samsung Electronics Co., Ltd. (KR)

( * ) Notice: Subject to any disclaimer, the term of this patent is extended or adjusted under 35 U.S.C. 154(b) by 400 days.

(21) Appl. No.: 13/444,079

(22) Filed: Apr. 11, 2012

(65) Prior Publication Data

US 2014/0032812 A1   Jan. 30, 2014

Related U.S. Application Data

(60) Provisional application No. 61/474,013, filed on Apr. 11, 2011.

(51) Int. Cl.
| | |
|---|---|
| G11C 7/00 | (2006.01) |
| G11C 7/22 | (2006.01) |
| G11C 7/10 | (2006.01) |
| G11C 13/00 | (2006.01) |
| G11C 11/16 | (2006.01) |

(52) U.S. Cl.
CPC ...... *G11C 7/222* (2013.01); *G11C 7/22* (2013.01); *G11C 7/1018* (2013.01); *G11C 13/0002* (2013.01); *G11C 13/0007* (2013.01); *G11C 13/004* (2013.01); *G11C 13/0061* (2013.01); *G11C 13/0069* (2013.01); *G11C 2013/0088* (2013.01); *G11C 11/1659* (2013.01); *G11C 11/161* (2013.01); *G11C 11/1673* (2013.01)

(58) Field of Classification Search
USPC .......................................... 365/219, 220, 221
See application file for complete search history.

(56) References Cited

U.S. PATENT DOCUMENTS

| | | | | |
|---|---|---|---|---|
| 6,498,741 | B2 * | 12/2002 | Matsudera et al. | 365/63 |
| 6,801,144 | B2 * | 10/2004 | Matsudera et al. | 341/100 |
| 8,049,649 | B2 * | 11/2011 | Moon | 341/101 |
| 8,207,976 | B2 * | 6/2012 | Hein | 345/519 |

OTHER PUBLICATIONS

Takemura, R. Kawahara et al., Highly-scalable disruptive reading scheme for Gb-scale SPRAM and beyond, Memory Workshop (IMW), 2010 IEEE international, May 16, 2010, pp. 1-2.

* cited by examiner

*Primary Examiner* — Vanthu Nguyen
(74) *Attorney, Agent, or Firm* — Renaissance IP Law Group LLP

(57) ABSTRACT

A non-volatile memory (NVM) system compatible with double data rate, single data rate, or other high speed serial burst operation. The NVM system includes input and output circuits adapted to synchronously send or receive back-to-back continuous bursts of serial data at twice the frequency of any clock input. Each burst is J bits in length. The NVM system includes read and write circuits that are adapted to read or write J bits of data at a time and in parallel, for each of a multitude of parallel data paths. Data is latched such that write time is similar for each bit and is extended to the time it takes to transmit an entire burst. Consequently, the need for small and fast sensing circuits on every column of a memory array, and fast write time at twice the frequency of the fastest clock input, are relieved.

18 Claims, 21 Drawing Sheets

| Burst Length | Starting Column Address | | | | Order of Accesses Within a Burst | |
|---|---|---|---|---|---|---|
| | | | | | Type = Sequential | Type = Interleaved |
| 2 | | | | A0 | | |
| | | | | 0 | 0-1 | 0-1 |
| | | | | 1 | 1-0 | 1-0 |
| 4 | | | A1 | A0 | | |
| | | | 0 | 0 | 0-1-2-3 | 0-1-2-3 |
| | | | 0 | 1 | 1-2-3-0 | 1-0-3-2 |
| | | | 1 | 0 | 2-3-0-1 | 2-3-0-1 |
| | | | 1 | 1 | 3-0-1-2 | 3-2-1-0 |
| 8 | | A2 | A1 | A0 | | |
| | | 0 | 0 | 0 | 0-1-2-3-4-5-6-7 | 0-1-2-3-4-5-6-7 |
| | | 0 | 0 | 1 | 1-2-3-4-5-6-7-0 | 1-0-3-2-5-4-7-6 |
| | | 0 | 1 | 0 | 2-3-4-5-6-7-0-1 | 2-3-0-1-6-7-4-5 |
| | | 0 | 1 | 1 | 3-4-5-6-7-0-1-2 | 3-2-1-0-7-6-5-4 |
| | | 1 | 0 | 0 | 4-5-6-7-0-1-2-3 | 4-5-6-7-0-1-2-3 |
| | | 1 | 0 | 1 | 5-6-7-0-1-2-3-4 | 5-4-7-6-1-0-3-2 |
| | | 1 | 1 | 0 | 6-7-0-1-2-3-4-5 | 6-7-4-5-2-3-0-1 |
| | | 1 | 1 | 1 | 7-0-1-2-3-4-5-6 | 7-6-5-4-3-2-1-0 |
| 16 | A3 | A2 | A1 | A0 | | |
| | 0 | 0 | 0 | 0 | 0-1-2-3-4-5-6-7-8-9-A-B-C-D-E-F | 0-1-2-3-4-5-6-7-8-9-A-B-C-D-E-F |
| | 0 | 0 | 0 | 1 | 1-2-3-4-5-6-7-8-9-A-B-C-D-E-F-0 | 1-0-3-2-5-4-7-6-9-8-B-A-D-C-F-E |
| | 0 | 0 | 1 | 0 | 2-3-4-5-6-7-8-9-A-B-C-D-E-F-0-1 | 2-3-0-1-6-7-4-5-A-B-8-9-E-F-C-D |
| | 0 | 0 | 1 | 1 | 3-4-5-6-7-8-9-A-B-C-D-E-F-0-1-2 | 3-2-1-0-7-6-5-4-B-A-9-8-F-E-D-C |
| | 0 | 1 | 0 | 0 | 4-5-6-7-8-9-A-B-C-D-E-F-0-1-2-3 | 4-5-6-7-0-1-2-3-C-D-E-F-8-9-A-B |
| | 0 | 1 | 0 | 1 | 5-6-7-8-9-A-B-C-D-E-F-0-1-2-3-4 | 5-4-7-6-1-0-3-2-D-C-F-E-9-8-B-A |
| | 0 | 1 | 1 | 0 | 6-7-8-9-A-B-C-D-E-F-0-1-2-3-4-5 | 6-7-4-5-2-3-0-1-E-F-C-D-A-B-8-9 |
| | 0 | 1 | 1 | 1 | 7-8-9-A-B-C-D-E-F-0-1-2-3-4-5-6 | 7-6-5-4-3-2-1-0-F-E-D-C-B-A-9-8 |
| | 1 | 0 | 0 | 0 | 8-9-A-B-C-D-E-F-0-1-2-3-4-5-6-7 | 8-9-A-B-C-D-E-F-0-1-2-3-4-5-6-7 |
| | 1 | 0 | 0 | 1 | 9-A-B-C-D-E-F-0-1-2-3-4-5-6-7-8 | 9-8-B-A-D-C-F-E-1-0-3-2-5-4-7-6 |
| | 1 | 0 | 1 | 0 | A-B-C-D-E-F-0-1-2-3-4-5-6-7-8-9 | A-B-8-9-E-F-C-D-2-3-0-1-6-7-4-5 |
| | 1 | 0 | 1 | 1 | B-C-D-E-F-0-1-2-3-4-5-6-7-8-9-A | B-A-9-8-F-E-D-C-3-2-1-0-7-6-5-4 |
| | 1 | 1 | 0 | 0 | C-D-E-F-0-1-2-3-4-5-6-7-8-9-A-B | C-D-E-F-8-9-A-B-4-5-6-7-0-1-2-3 |
| | 1 | 1 | 0 | 1 | D-E-F-0-1-2-3-4-5-6-7-8-9-A-B-C | D-C-F-E-9-8-B-A-5-4-7-6-1-0-3-2 |
| | 1 | 1 | 1 | 0 | E-F-0-1-2-3-4-5-6-7-8-9-A-B-C-D | E-F-C-D-A-B-8-9-6-7-4-5-2-3-0-1 |
| | 1 | 1 | 1 | 1 | F-0-1-2-3-4-5-6-7-8-9-A-B-C-D-E | F-E-D-C-B-A-9-8-7-6-5-4-3-2-1-0 |

FIG. 6
(PRIOR ART)

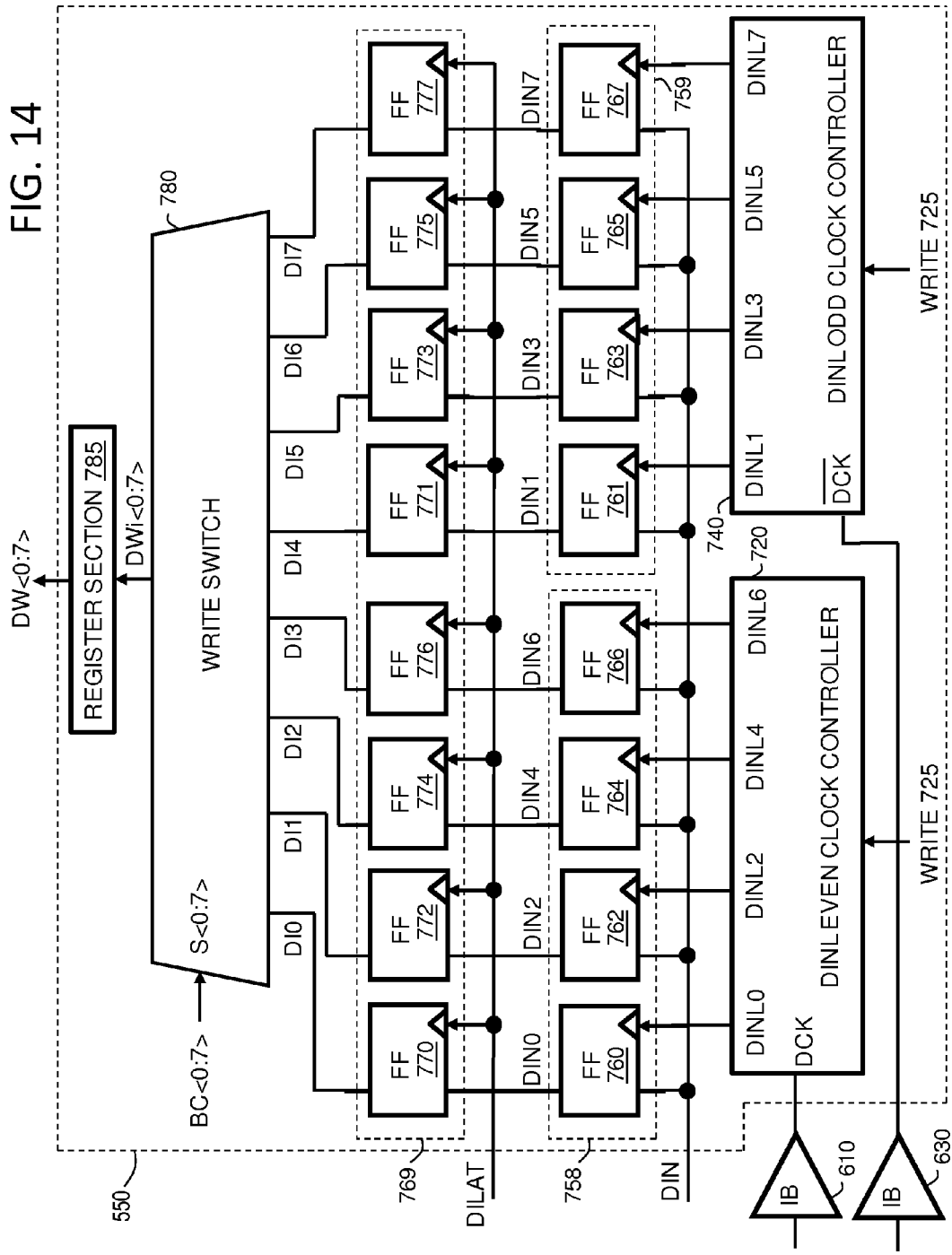

`US 9,001,607 B2`

METHOD AND DESIGN FOR HIGH PERFORMANCE NON-VOLATILE MEMORY

CROSS-REFERENCES TO RELATED APPLICATIONS

This application claims the benefit of U.S. Provisional Application No. 61/474,013, filed Apr. 11, 2011, the contents of which are incorporated herein by reference in their entirety. This application is related to U.S. Patent Application No. 61/363,576, filed Jul. 12, 2010; U.S. Patent Application No. 61/352,306, filed Jun. 7, 2010; U.S. patent application Ser. No. 12/558,451, filed Sep. 11, 2009; U.S. patent application Ser. No. 12/544,189, filed Aug. 19, 2009; U.S. patent application Ser. No. 12/903,152, filed Oct. 12, 2010; U.S. patent application Ser. No. 13/013,616, filed Jan. 25, 2011, and U.S. patent application Ser. No. 13/083,854, filed Apr. 11, 2011, the contents of all of which are incorporated herein by reference in their entirety.

STATEMENT AS TO RIGHTS TO INVENTIONS MADE UNDER FEDERALLY SPONSORED RESEARCH OR DEVELOPMENT

This invention was made with U.S. Government support under Grant/Contract No. HR0011-09-C-0023 awarded by the DARPA. The U.S. Government retains certain rights in this invention.

BACKGROUND

The present inventive concepts relate to memory integrated circuits, and more particularly to enabling higher data bandwidth in random access memory while maintaining compatibility with industry standards.

Semiconductor memory devices have been widely used in electronic systems to store data. There are generally two types of semiconductor memories, including non-volatile and volatile memories. A volatile memory device, such as a Static Random Access Memory (SRAM) or a Dynamic Random Access Memory (DRAM) device, loses its data when the power applied to it is turned off. In contrast, a non-volatile semiconductor memory device, such as a Flash, Erasable Programmable Read Only Memory (EPROM) or a magnetic random access memory (MRAM), retains its charge even after the power applied thereto is turned off. Therefore, where loss of data due to power failure or termination is unacceptable, a non-volatile memory is used to store the data.

FIG. 1A is a simplified cross-sectional view of a magnetic tunnel junction (MTJ) structure 10 used in forming a spin transfer torque (STT) MRAM cell. MTJ 10 is shown as including, in part, a reference layer 12, a tunneling layer 14, and a free layer 16. Reference layer 12 and free layer 16 are ferromagnetic layers. Tunneling layer 14 is a nonmagnetic layer. The direction of magnetization of reference layer 12 is fixed and does not change. The direction of magnetization of free layer 16, however, may be varied by passing a sufficiently large current through the MTJ structure. In FIG. 1A, reference layer 12 and free layer 16 are assumed to have the same magnetization direction, i.e., they are in a parallel state. In FIG. 1B, reference layer 12 and free layer 16 are assumed to have opposite magnetization directions, i.e., they are in an anti-parallel state. In FIG. 1C, reference layer 12 and free layer 16 are assumed to have the same magnetization direction perpendicular to a plane defined by the interface of free layer 16 and tunneling layer 14. In FIG. 1D, reference layer 12 and free layer 14 are assumed to have opposite magnetization directions perpendicular to a plane defined by the interface of free layer 16 and tunneling layer 14.

To switch from the parallel state, as shown in FIG. 1A, to the anti-parallel state, as shown in FIG. 1B, the voltage potential of reference layer 12 is increased relative to that of free layer 16. This voltage difference causes spin polarized electrons flowing from free layer 16 to reference layer 12 to transfer their angular momentum and change the magnetization direction of free layer 16 to the anti-parallel state, as shown in FIG. 1B. To switch from the anti-parallel state to the parallel state, the voltage potential of free layer 16 is increased relative to that of reference layer 12. This voltage difference causes spin polarized electrons flowing from reference layer 12 to free layer 16 to transfer their angular momentum and change the magnetization direction of free layer 16 to the parallel state, as shown in FIG. 1A.

To switch from the parallel state to the non-parallel state or vice versa, the voltage applied to MTJ 10 and the corresponding current flowing through MTJ must be greater than a respective pair of threshold values. The voltage that must exceed a threshold voltage in order for the switching to occur is also referred to as the switching voltage $V_c$. Likewise, the current that must exceed a threshold current in order for the switching to occur is referred to as the switching current $I_c$. As is well known, when free layer 16 and reference layer 12 have the same magnetization direction (i.e., parallel state), MTJ 10 has a relatively low resistance. Conversely, when free layer 16 and reference layer 12 have the opposite magnetization direction (i.e., anti-parallel state), MTJ 10 has a relatively high resistance. Due to the physical properties of an MTJ, the critical current required to change an MTJ from a parallel state to an anti-parallel state is often greater than the critical current required to change the MTJ from an anti-parallel state to a parallel state.

FIG. 2A shows an MTJ 10 and an associated select transistor 20 together forming an STT-MRAM cell 30. Transistor 20 is often an NMOS transistor due to its inherently higher current drive, lower threshold voltage, and smaller area relative to a PMOS transistor. As is described further below, the current used to write a "1" in MRAM 30 is different than the current used to write a "0". The asymmetry in the direction of current flow during these two write conditions is caused by the asymmetry in the gate-to-source voltage of transistor 20. Accordingly, a write driver adapted to deliver sufficient current to write a "0", may not be able to provide enough current to write a "1". Similarly, a write driver adapted to deliver sufficient current to write a "1" may deliver a current that is greater than what would otherwise be an acceptable current level to write a "0".

In the following description, an MRAM cell is defined as being in a logic "0" state when the free and reference layers of its associated MTJ are in a parallel (P) state, i.e., the MTJ exhibits a low resistance. This low resistance state is also alternatively shown as $R_{low}$ or $R_P$ state. Conversely, an MRAM cell is defined as being in a logic "1" state when the free and reference layers of its associated MTJ are in an anti-parallel (AP) state, i.e., the MTJ exhibits a high resistance. This high resistance state is also alternatively shown as $R_{high}$ or $R_{AP}$ state. It will be understood that in other embodiments, the MRAM cell can be defined as being in the logic "0" state when in an AP state, and the logic "1" state when in a P state. Furthermore, in the following, it is assumed that the reference layer of the MTJ faces its associated select transistor, as shown in FIG. 2A. Therefore, in accordance with the discussion above, a current flowing along the direction of arrow 35 (i.e., the up direction) either (i) causes a switch from the P state to the AP state thus to write a "1", or (ii) stabilizes the previously established AP state of the associated MTJ. Likewise, a current flowing along the direction of arrow 40 (i.e., the down direction) either (i) causes a switch from the AP state to the P state thus to write a "0", or (ii) stabilizes the previously established P state of the associated MTJ. It is understood, however, that in other embodiments this orientation may be reversed so that the free layer of the MTJ faces its associated select transistor. In such embodiments (not shown), a current flowing along the direction of arrow 35 either (i) causes a switch from the AP state to the P, or (ii) stabilizes the previously established P state of the associated MTJ Likewise, in such embodiments, a current flowing along the direction of arrow 40 either (i) causes a switch from the P state to the AP state, or (ii) stabilizes the previously established AP state. FIG. 2B is a schematic representation of MRAM 30 of FIG. 2A in which MTJ 10 is shown as a storage element whose resistance varies depending on the data stored therein. The MTJ changes its state (i) from P to AP when the current flows along arrow 35, and/or (ii) from AP to P when the current flows along arrow 40.

As described above, the voltage required to switch an MTJ from an AP state to a P state, or vice versa, must exceed a critical value $V_c$. The current corresponding to this voltage is referred to as the critical current $I_c$. FIG. 3 represents the variation in the MTJ state (or its resistance) during various write cycles. To transition from the P state (i.e., low resistance state) to AP state (i.e., high resistance state), a positive voltage of $V_c$ is applied. Once in the AP state, removing the applied voltage does not affect the state of the MTJ. Likewise, to transition from the AP state to the P state, a negative voltage of $V_c$ is applied. Once in the P state, removing the applied voltage does not affect the state of the MTJ. The resistance of the MTJ is $R_{high}$ when it is in AP state and receives no or very small voltage. Likewise, the resistance of the MTJ is $R_{low}$ when it is in P state and receives no or very small voltage.

FIG. 4A shows an MTJ 10 being programmed to switch from an anti-parallel state (i.e., high resistance state, or logic "1" state) to a parallel state so as to store a "0" (i.e., low resistance state, or logic "0" state). It is assumed that MTJ 10 is initially in a logic "1" or AP state. As described above, to store a "0", a current $I_c$ greater than the critical current is caused to flow through transistor 20 in the direction of arrow 40. To achieve this, the source node (SL or source line) of transistor 20 is coupled to the ground potential via a resistive path (not shown), a positive voltage Vpp is applied to the gate node (WL or wordline) of transistor 20, and a positive voltage $V_{cc}$ is applied to the drain node (BL or bitline) of transistor 20.

FIG. 5 is an exemplary timing diagram of the voltage levels at nodes WL, SL, SN and BL during write "0" operation, occurring approximately between times 25 ns and 35 ns, and write "1" operation, occurring approximately between times 45 ns and 55 ns, for a conventional MTJ such as MTJ 10 shown in FIGS. 4A and 4B. Supply voltage $V_{cc}$ is assumed to be 1.8 volts. Signal WL, as well as signal CS, which is a column select signal, are shown as having been boosted to a higher Vpp programming voltage of about 3.0 volts. During the write "0" operation, the voltages at nodes BL, SL and SN are shown as being approximately equal to about 1.43 V, 0.34 V, and 0.88 V respectively. During the write "1" operation, the voltages at nodes BL, SL and SN are shown as being approximately equal to about 0.21 V, 1.43 V, and 0.84 V respectively. Although not shown, for this exemplary computer simulation, the currents flowing through the MTJ during write "0" and "1" operations are respectively 121 µA and 99.2 µA.

FIG. 4B shows an MTJ being programmed to switch from a parallel state to an anti-parallel state so as to store a "1". It is assumed that MTJ 10 is initially in a logic "0" or P state. To store a "1", a current $I_c$ greater than the critical current is caused to flow through transistor 20 in the direction of arrow 35. To achieve this, node SL is supplied with the voltage $V_{cc}$ via a resistive path (not shown), node WL is supplied with the voltage Vpp, and node BL is coupled to the ground potential via a resistive path (not shown). Accordingly, during a write "1" operation, the gate-to-source voltage of transistor 20 is set to $(V_{WL}-V_{SN})$, and the drain-to-source voltage of transistor 20 is set to $(V_{SL}-V_{SN})$.

Dynamic random access memory (DRAM) is commonly used in many computing systems. Double data rate (DDR) is a type of synchronous (S)DRAM used to increase the speed of data reading and writing, or bandwidth, by using both the rising and falling edge of the clock signal to transfer data. The higher data bandwidth in DDR SDRAM is accommodated, in part, by the memory architecture having data be available simultaneously, and in parallel, for most if not all memory columns being accessed. That is accomplished by voltage sensing and latching the data locally at a sense amplifier on each memory column along a selected row. For example, during read, once a row is selected, all the data bits on all the columns along that row are sensed and latched and available for cycling out of the part. The row access and data sensing time is a relatively long time; however, that time is made up by having all the data on a row available simultaneously. Then, the data from the columns may be cycled out of the memory very quickly during a burst operation. The burst operation relieves the address bus from cycling through each column address to conserve power, speed up operation, and to simplify the system while taking advantage that the processor frequently uses sequential data streams. Burst operation is provided by sending a column start address to the memory which then uses an internally generated count to sequentially select columns to rapidly "burst" a certain number of bits out on each of the memory's I/O pins from the memory's burst buffer. The number of internally pre-fetched bits x corresponds to DDRx type memory. FIG. 6 shows a table for a DDR SDRAM industry standard for the order of accesses within a burst by the logical column start address for burst lengths of 2, 4, 8 or 16 bits. DDR DRAM write operations are performed analogously to latch and store all the data along a selected row.

Most resistive type non-volatile memory (NVM), such as STT-RAM, or ReRAM for example, use current sense amplifiers to read out data. Current sensing circuits directly detect memory cell current as a signal. It is inherently faster than voltage sensing because it avoids large voltage swings of the highly capacitive bitlines. However, circuit complexity for current sensing takes more chip area than voltage sensing, which may preclude having a sense amplifier for every bitline, especially for the small bitline pitch found in tightly pitched memory cell arrays. The bitline pitch can be as small as 2 F, where F is the minimum feature size.

In DRAM architectures, a page size is typically 1K Bytes (8 Kb) to 2 K Bytes (16 kb). All 1 KB or 2 KB must be activated and latched at the same time even though the user may only need to fetch 8 Bytes or 16 Bytes of data or less. It would be desirable to provide a method and system to enable high bandwidth operation similar to DRAM page mode burst operation, but without reading the entire page as in the case of DRAM.

It would also be desirable to increase the array efficiency and save die size by locating the current sense amplifiers outside the memory array block so that they are shared with the entire memory block. It would also be desirable to attain power savings on the order of 1000 times.

BRIEF SUMMARY

According to one embodiment of the inventive concept, a non-volatile memory circuit includes a write circuit adapted to synchronously latch a serial burst having a multitude of bits and to store the multitude of bits to a multitude of memory cells in parallel. A read circuit is adapted to receive the multitude of bits stored in the multitude of memory cells in parallel and to synchronously provide the multitude of bits as a serial burst.

BRIEF DESCRIPTION OF THE DRAWINGS

FIG. 6 shows a table for a DDR SDRAM industry standard for the order of accesses within a burst by the logical column start address for burst lengths of 2, 4, 8 or 16 bits, as known in the prior art.

FIG. 14 is an exemplary block diagram of a data input circuit and a multitude of input buffers, in accordance with one embodiment of the inventive concept.

DETAILED DESCRIPTION

An NVM system, in accordance with various embodiments of the inventive concept, may include input and output circuits adapted to synchronously send or receive back-to-back continuous bursts of serial data with performance up to and including twice the frequency of any clock input. The input and output circuits may be compatible with double data rate, single data rate, or other high speed serial burst operation. Each burst is J bits in length. The NVM system also includes read and write circuits that are adapted to read or write J bits of data at a time and in parallel for each of a multitude of parallel data paths. "In parallel" when used in the context of time herein means simultaneously and/or substantially simultaneously. Input data is latched such that write time is similar for each bit and is extended to the time it takes to transmit an entire burst of data. Consequently, the need for (i) small and fast sensing circuits on every column of an NVM array and (ii) fast write time at twice the frequency of the fastest clock input, are relieved.

Figure 1A:
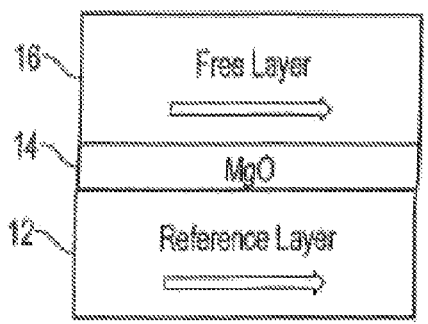
FIG. 1A is a simplified cross-sectional view of a magnetic tunnel junction structure of a magnetic random access memory cell when placed in a parallel magnetization state, as known in the prior art.
Figure 1B:
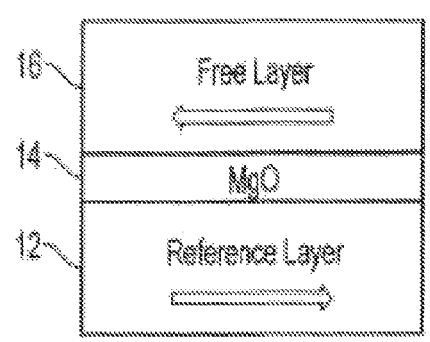
FIG. 1B shows the magnetic tunnel junction structure of FIG. 1A when placed in an anti-parallel magnetization state, as known in the prior art.
Figure 1C:
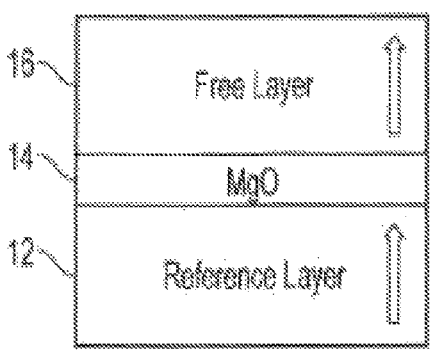
FIG. 1C is a simplified cross-sectional view of a magnetic tunnel junction structure of a magnetic random access memory (MRAM) cell when placed in a parallel magnetization state, as known in the prior art.
Figure 1D:
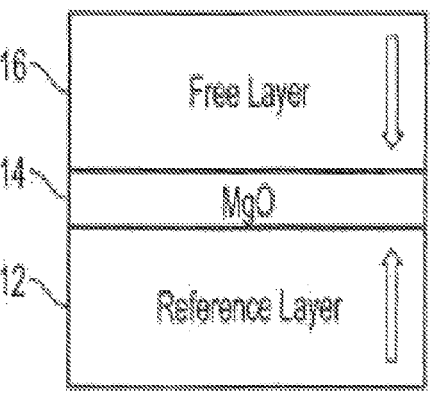
FIG. 1D shows the magnetic tunnel junction structure of FIG. 1D when placed in an anti-parallel magnetization state, as known in the prior art.
Figure 2A:
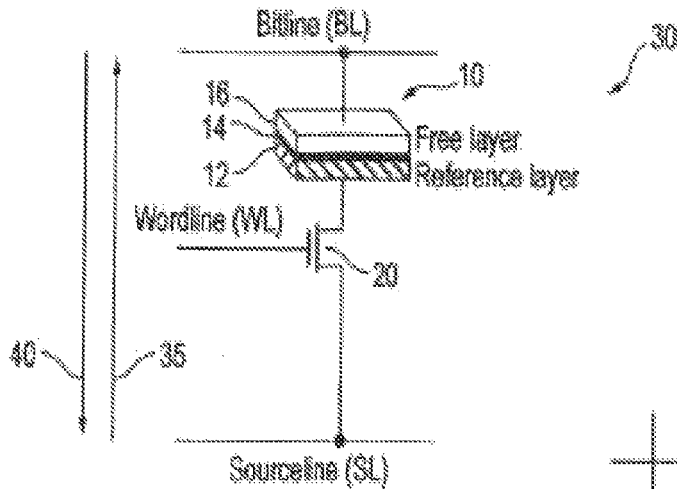
FIG. 2A shows a number of layers of a magnetic tunnel junction structure coupled to an associated select transistor, as known in the prior art.
Figure 2B:
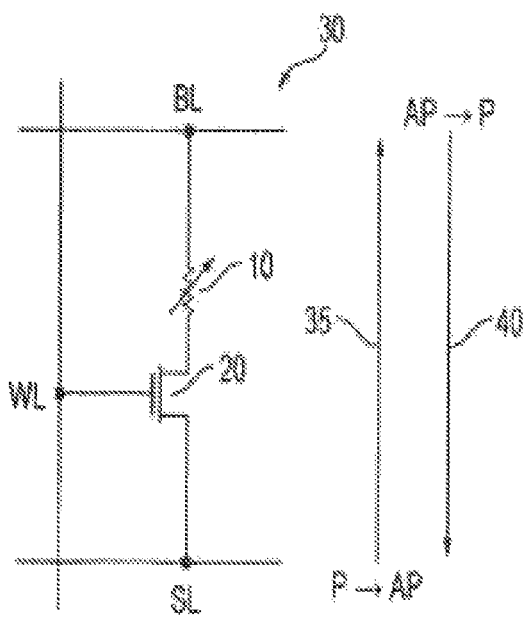
FIG. 2B is a schematic representation of the magnetic tunnel junction structure and its associated select transistor of FIG. 2A, as known in the prior art.
Figure 3:
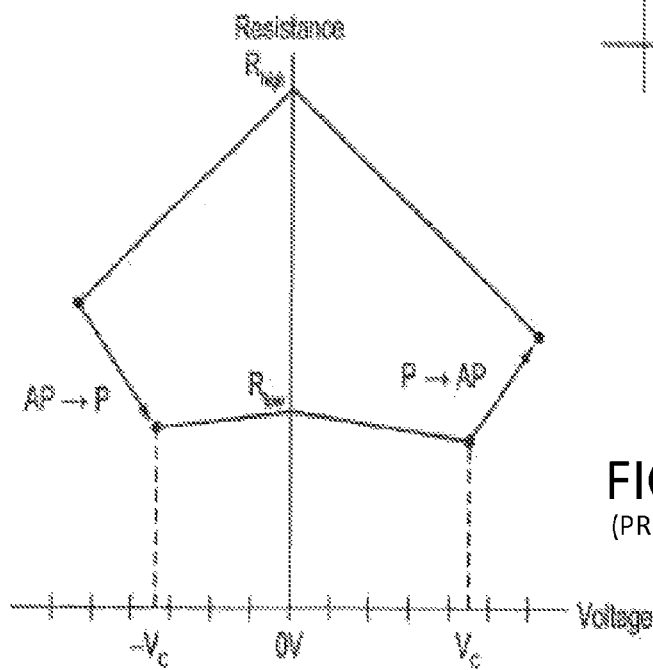
FIG. 3 shows the variation in the resistance of the magnetic tunnel junction structure of FIG. 2A in response to applied voltages, as known in the prior art.
Figure 4A:
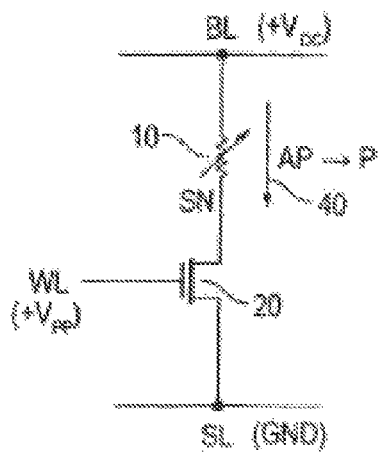
FIGS. 4A-4B show a magnetic tunnel junction structure being programmed to switch between an anti-parallel state and a parallel state, as known in the prior art.
Figure 4B:
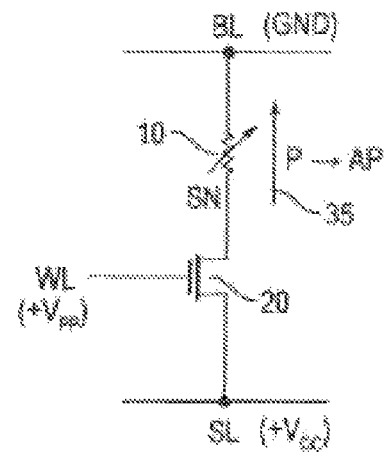
Figure 5:
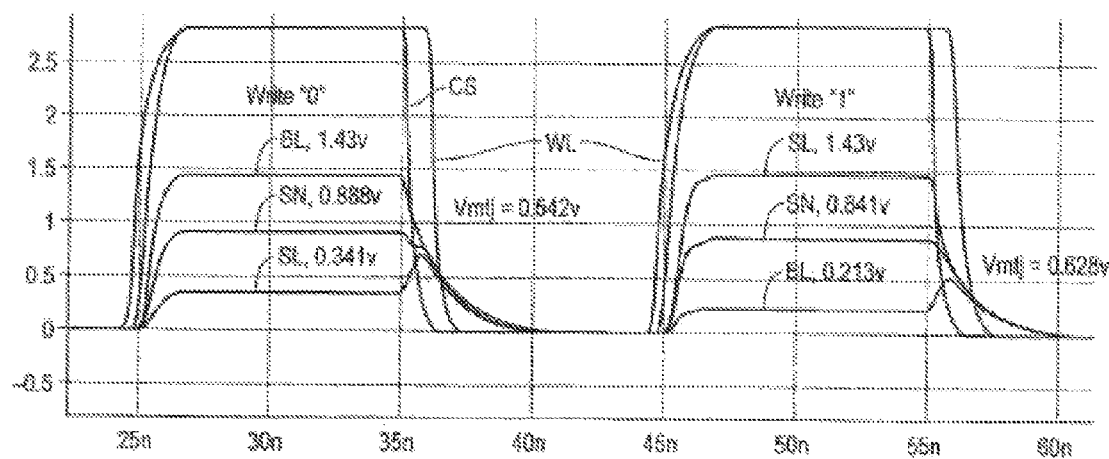
FIG. 5 is an exemplary timing diagram of a number of signals associated with a magnetic random access memory during write "0" and write "1" operations, as known in the prior art.
Figure 7:
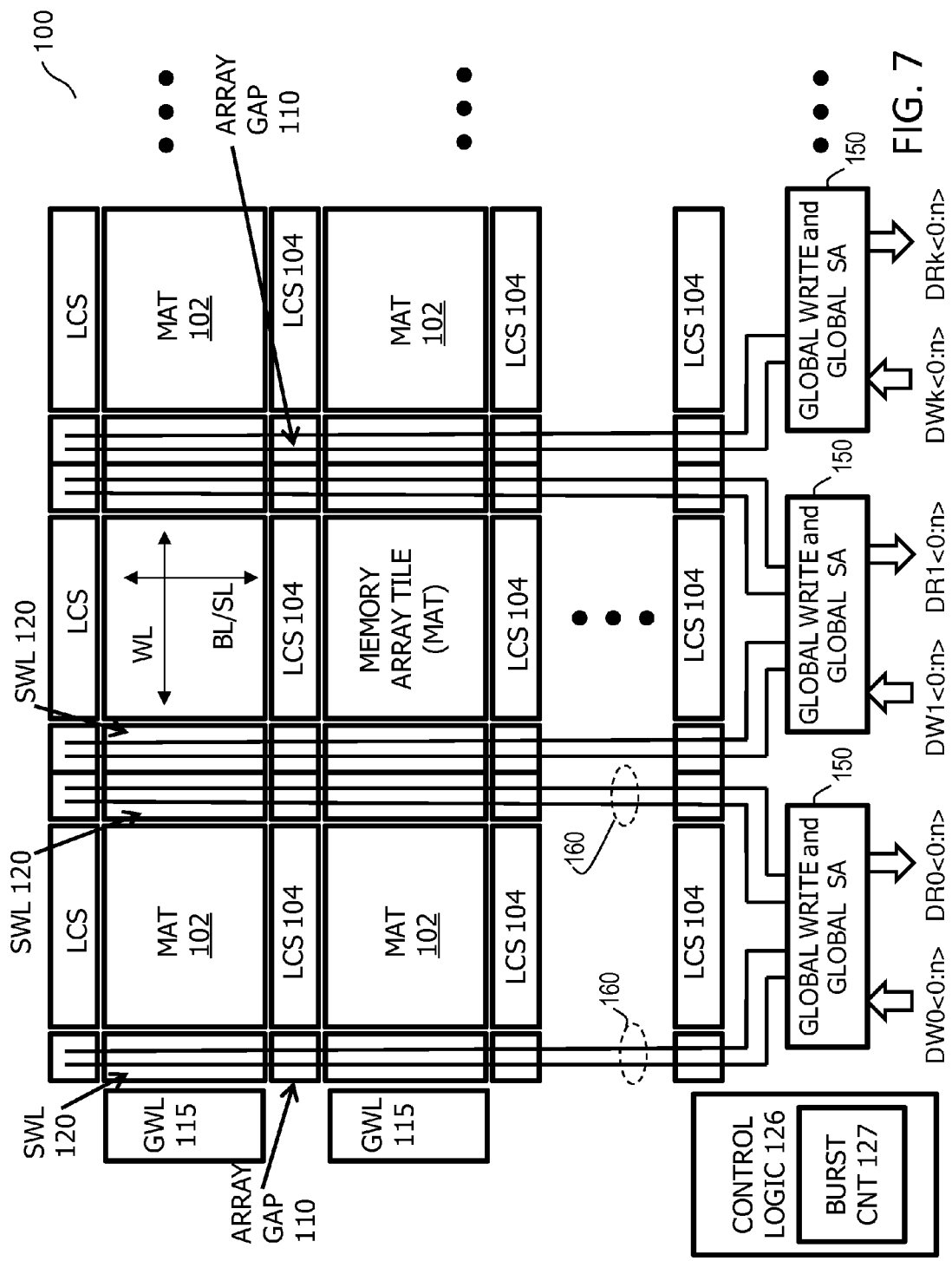
FIG. 7 is an exemplary block diagram of an NVM system and associated circuitry, in accordance with one embodiment of the inventive concept.

FIG. 7 is an exemplary block diagram of an NVM system 100 and associated circuitry, in accordance with one embodiment of the inventive concept. NVM system 100 includes a multitude of array blocks selected by column select drivers, a multitude of global write and global sense amplifiers (SA_b) blocks 150, a multitude of global word line (GWL) circuits, e.g. 115, and a control circuit 125, which includes control logic. The control logic 125 can include a J-deep burst counter 127, the operation of which is further described below. The multitude of global write and global sense amplifier (SA_b) blocks 150 receive input (i.e., write) data signals DW0<0:n>, DW1<0:n>, ..., to DWk<0:n>, and transmit output (i.e., read) data signals DR0<0:n>, DR1<0:n>, ..., DRk<0:n>, where k is (burst length minus 1) and n is (number of I/Os minus 1).

To simplify the terminology and associated description herein, the burst length in terms of number of bits is referred to as J and the number of I/Os is referred to as M. Thus, k is equal to J-1 and n is equal to M-1. In other words, reference is made herein to J DR_k values (e.g., DR0<0:n>, DR1<0:n>, ..., DR7<0:n>, where k=7 and J=8). Similarly, reference is made herein to M number of I/Os (e.g., n=3 and M=4), where M I/Os can refer, for example, to M DQs (e.g., DQ<0:3>). It will be understood that while some embodiments described herein assume k=7, J=8, n=3, and M=4 for the sake of illustration and explanation, a different burst length and/or a different number of I/Os can be used and still fall within the intended scope of the various embodiments of the inventive concept. For example, J can be an integer greater than one (1) and represents the number of bits to be burst in or out respectively, and M can be an integer greater than zero (0) and represents the number of I/Os or DQs.

By way of further examples, the value of J may be 2, 4, 8, or 16 bits. The value of J may be user-selectable or programmable via command signals sent to the control logic. While n is illustrated in FIG. 7 as ranging from <0:3>, which corresponds to M being equal to 4, it will be understood that M may have a different value such as 8 or 16, or in other words, n may range from <0:7> or <0:15>, respectively, and so forth. Each array block may include an array of physical memory cells (memory array tile, or MAT) 102 whose rows are selected by one or more sub word line (SWL) circuits, e.g. 120, and whose columns are selected by one or more local column select circuits (LCS), e.g. LCS 104. The corners of each block include an array gap area, e.g. 110, to be described in further detail below.

One or more MAT 102 may be coupled to each of the multitude of J global write and global SA_b blocks 150 via an array gap area 110, and via a multitude of M global bit lines (GBL_n), e.g. 160, and a multitude of M global write lines (GWRL_n). e.g. 160. Each global write and global SA_b block 150 inputs M data write (e.g., DW_k<0:n>) signals and outputs M data read (e.g., DR_k<0:n>) signals Each of the multitude of J global write and global SA_b blocks 150 may be coupled to one or more data input/output (DQ_b) connections, which couple b data bits in parallel to and from the NVM system as described in further detail below. For example, the value of b may be any integer equal or greater than 1 but more typically 1, 4, 8, 9, 16, 32 or 64, according to various embodiments of the inventive concept. The following embodiments described herein will describe the data path for one of the b parallel data bits, it being understood the remaining b data paths are essentially similar for a memory that is b bits wide. It should be noted the terms sensing and reading may be used interchangeably herein, as are the terms sense and read. In one embodiment, the b data paths may not reside on the same chip but instead reside in separate chips.

Memory array tile 102 includes many columns, wordlines and cells located at the intersections of the columns and wordlines. Each cell is capable of storing a logical data bit, which corresponds to a value of logical 1 or logical 0. By way of example, some of the embodiments described below will include STT-MRAM cells previously described. For example, the physical memory cell may be a ROM, PROM, EEPROM, FLASH, FeRAM, PRAM, ReRAM, MRAM or STT-MRAM cell depending on the technology.

Figure 8:
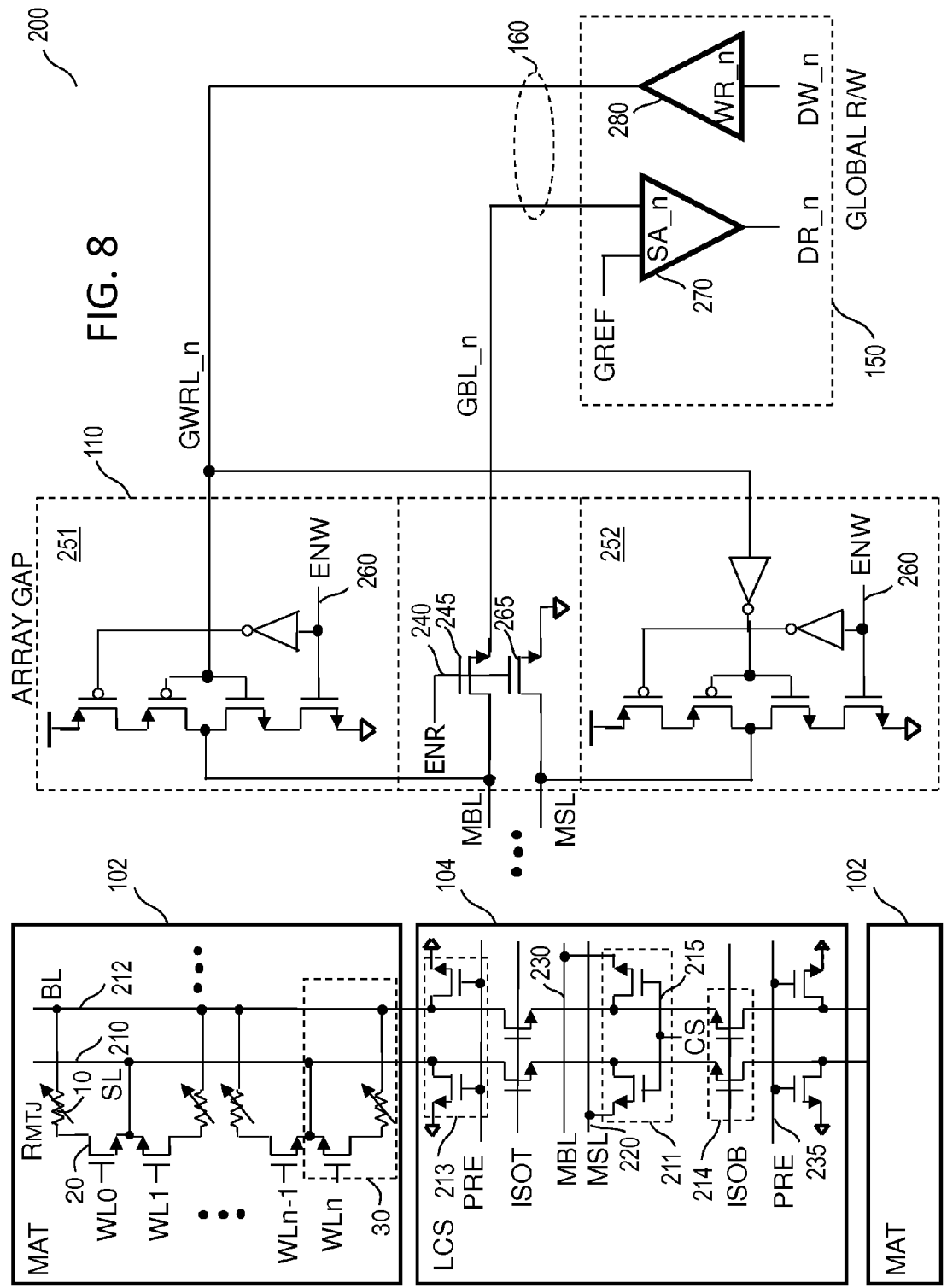
FIG. 8 is a schematic diagram of portions of an NVM system and associated writing and reading circuitry, in accordance with one embodiment of the inventive concept.

FIG. 8 is a schematic diagram 200 of portions of a NVM system 100 and associated writing and reading circuitry, in accordance with one embodiment of the inventive concept. Schematic diagram 200 includes MAT 102, LCS 104, array gap 110, and a global read/write (R/W) block 150, or sub-block thereof. The term "global R/W block" refers to the global write and global SA_b block 150 described in FIG. 7. Referring again to FIG. 8, each global R/W block 150 includes a multitude of M sense amplifiers SA_n 270 and a multitude of M write buffers WR_n 280. The global R/W block 150 is coupled to the array gap 110 via M GBL_n and M GWRL_n 160 signal lines. The array gap 110 is coupled to the LCS 104 via M pairs of signal lines, MBL and MSL, however, one pair is shown to simplify the drawing. The M MBL and MSL pairs may be physically distributed among a multitude of MATs or in one MAT according to various embodiments of the inventive concept.

During a write operation, a DW_n signal corresponding to a data bit is driven by WR_n 280 onto the GWRL_n line, which is coupled to a pair of write driver circuits 251 and 252. If the control logic enables an enable write ENW signal, write driver 251 drives the MBL line with the signal on GWRL_n and write driver 252 drives the MSL line with the inverted GWRL_n signal. During the write operation, the control logic disables an enable read ENR 240 signal, which controls two n-channel pass transistors (e.g., 245 and 265) in the array gap that then isolate GBL_n from MBL. Thus, the M write buffers WR_n 280 couple M data bits on M DW_n lines to M MBL/MSL pairs in the LCS 104 via 2×M write drivers in the array gap 110, in parallel and substantially at the same time.

During a read operation, the control logic enables the enable read ENR signal, which couples the MBL signal to GBL_n, and MSL to ground, via the two n-channel pass transistors in the array gap, respectively. In other words, the MBL signal is coupled to GBL_n using an n-channel pass transistor 245, and the MSL signal is coupled to ground using an n-channel pass transistor 265. In turn, the signal on GBL_n and the global reference signal GREF are input to one of then SA_n. The SA_n 270 then outputs a signal corresponding to the sensed data bit on a DR_n signal line. During the read operation, the control logic disables ENW 260, which isolates write drivers 251 and 252 from MBL and MSL, respectively. Thus, M MSL lines are grounded and M MBL lines in the LCS 104 are coupled to M SA_n. The M SA_n sense M data bits and couple the M data bits onto M DR_n lines via M n-channel pass transistors 245 in the array gap 110, in parallel and substantially at the same time. In some embodiments, the write drivers may be located globally and outside the array gap (not shown).

MAT 102 includes a number of MRAM cells 30 whose select transistors are coupled to word lines WL0-WL(n) driven by the SWL circuits 120 and the GWL circuits 115 described above in connection with FIG. 7. In reference to FIG. 8, the multitude of MRAM cells 30 are also coupled to a source line (SL) 210 and a bit line (BL) 212 pair, which may form part of the column. The MAT 102 includes a multitude of SL and BL pairs selectable by LCS 104.

The LCS includes a pair of n-channel select transistors 211, several pairs of n-channel precharge transistors 213 and several pairs of n-channel isolation transistors 214, which couple a selected SL and BL pair in MAT 102 to a pair of MSL 220 and MBL 230 lines under control of a column select (CS) signal 215, a precharge (PRE) signal 235, an isolation top (ISOT) signal, and an isolation bottom (ISOB) signal. Alternatively, the LCS 104 may include CMOS pass gates driven by the CS signal 215 and an inverted CS signal (not shown) to couple the BL 212 and SL 210 lines to the MBL 230 and MSL 220 lines, instead of n-channel select transistors 211. LCS transistor pairs 211, 213 and 214 are replicated for each column. The LCS 104 determines whether to couple adjacent MATs 102 above and/or below the LCS to the MSL 220 and MBL 230 lines by enabling or otherwise controlling one or more of the respective ISOT or ISOB signals. For example, the top MAT 102 is selected by enabling ISOT and disabling ISOB. In embodiments without separate top and bottom MATs, the pairs of n-channel isolation transistors 214, and the ISOT and ISOB signals may be optional. One of the multitude of SL and BL pairs (or column) is selected by the CS signal 215 driven by the column select drivers (not shown), to couple the selected SL 210 and BL 212 pair to the respective MSL 220 and MBL 230 lines. The SL/BL and respective MSL/MBL lines are ready for write or read operation if PRE is disabled. MSL 220 and MBL 230 are coupled from LCS 104 to array gap 110.

The example shown in schematic diagram 200 includes STT-MRAM cells by way of example, but it would be recognized that the embodiment has a broader range of applicability. For example MAT 102 may include other memory cell types as discussed above. In one embodiment, one of the number of cells may include (i) one current carrying terminal coupled to BL 212, (ii) another current carrying terminal coupled to SL 210 and (iii) a control terminal coupled to the word-line. In another embodiment, one current carrying terminal of one of the number of cells may be connected to a power supply or ground potential directly within the MAT without having to be decoded by a column select signal. In this example, the column may include one signal line such as the BL signal, while the SL signal is connected to a power supply or ground potential within the MAT without decoding. In this embodiment, the LCS may include one n-channel select transistor to couple the column BL to the global BL through a single MBL line.

Each column in the MAT is selected by a corresponding CS signal. For example, J CS signals may be selected in parallel and substantially at the same time during a write or read operation. The column select drivers are controlled by the control logic, which is responsive to address and command inputs. Each selected CS can activate M bitlines (e.g., BL 212) and corresponding M MBL/MSL pairs to couple data in or out of the MAT. Thus, M MBL/MSL pairs are used in parallel and substantially at the same time. The M MBL and MSL pairs and corresponding J columns may be physically distributed among a multitude of MATs or in one MAT according to various embodiments of the inventive concept.

Figure 9A:
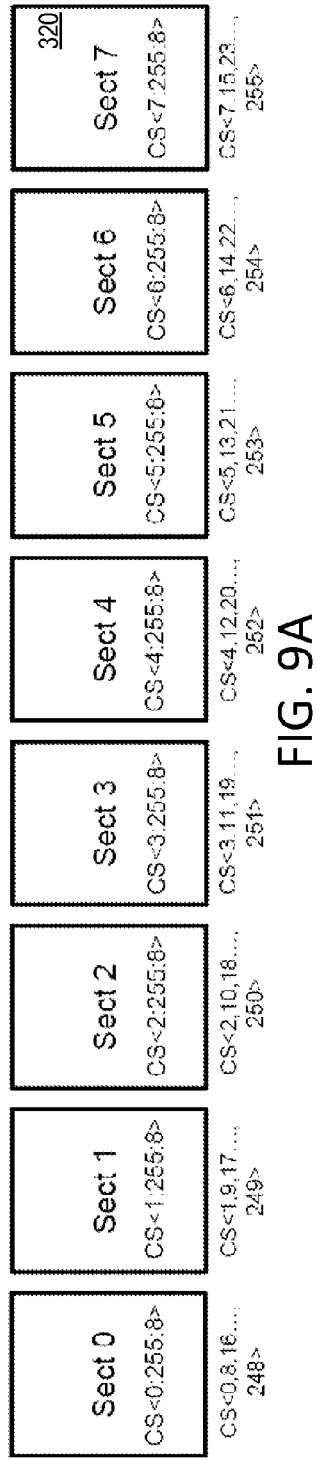
FIGS. 9A-9C are exemplary block diagrams of sector and column logical assignments for an NVM system, in accordance with one embodiment of the inventive concept.
Figure 9B:
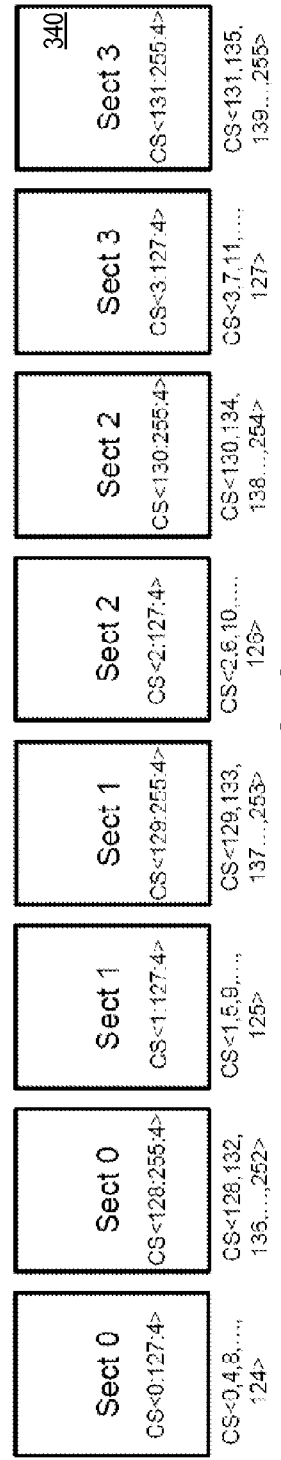
Figure 9C:
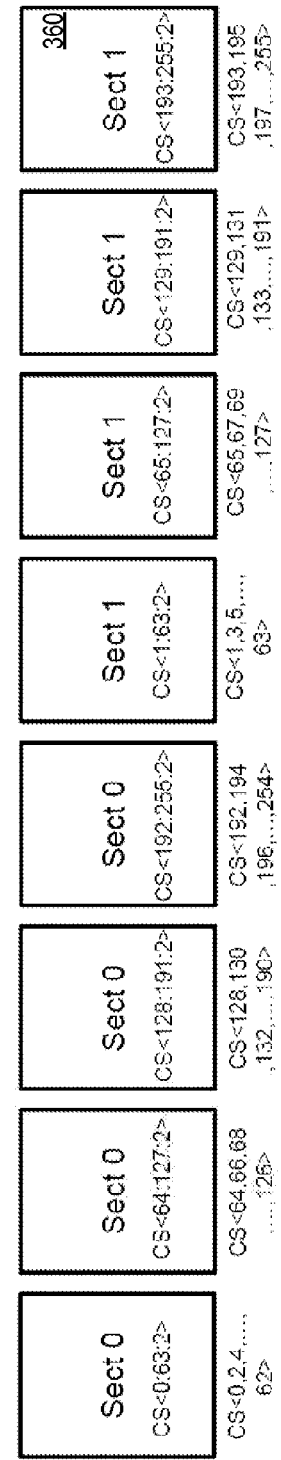

FIG. 9A-9C are exemplary block diagrams of sector and column logical assignments for a NVM system, in accordance with one embodiment of the inventive concept. In this example, 256 physical columns are divided into a multitude of logical sectors depending on burst length J. Each sector, in this example, includes 32 logical CS signals corresponding to 32 physical columns. The selection of CS signals and corresponding physical columns can be controlled by the control logic 125 (of FIG. 7) based on a logical start address and the output of the J-deep burst counter 127 in the control logic, where J is the burst length, which can be programmed by a mode register set command. The logical CS assignments for each sector are indicated by the nomenclature CS<i:h:k>, where i is the starting column with i=0 being the lowest possible, and h is the highest possible column, which is 255 in this embodiment. Other amounts of $2^N$ physical columns may be included and 256 is included by way of example according to various embodiments of the inventive concept. The sequence of CS selection by the control logic may implement the table for a DDR SDRAM industry standard described in reference to FIG. 6 for the order of column accesses within a burst based on the logical column start address for J=2, 4 and 8, and so forth.

FIG. 9A shows an embodiment with J equal to 8. The 256 columns are divided into 8 sectors and 8 CS signals are selected in parallel and substantially at the same time. A sector j 320 is assigned CS<j:255:8>, where j is an integer between 0 and 7. Sector 0 is assigned every other 8 CS starting at CS<0>. In other words, sector 0 is assigned CS<0, 8, 16, . . . , 248> or CS<0:255:8>. Sector 1 is assigned every other 8 CS starting at CS<1>. In other words, sector 1 is assigned CS<1, 9, 17, . . . , 249> or CS<1:255:8>. Sector 2 is assigned every other 8 CS starting at CS<2>. In other words, sector 2 is assigned CS<2, 10, 18, . . . , 250> or CS<2:255:8>. Similar assignments are made for sectors 3 through 7. Thus, sector 7 is assigned every other 8 CS starting at CS<7>. In other words, sector 7 is assigned CS<7, 15, 23, . . . , 255> or CS<2:255:8>.

FIG. 9B shows an embodiment with J equal to 4. The 256 columns are divided into 4 sectors and 4 CS signals are selected in parallel and substantially at the same time. A sector j 340 is assigned CS<j:127:4> and continuing with CS<(j+128):255:4>, where j is an integer between 0 and 3. Sector 0 is assigned every other 4 CS starting at CS<0>. In other words, sector 0 is assigned CS<0, 4, 8, . . . , 252> or CS<0:127:4> and continuing with CS<128:255:4>. Sector 1 is assigned every other 4 CS starting at CS<1>. In other words, sector 1 is assigned CS<1, 5, 9, . . . , 253> or CS<1: 127:4> and continuing starting with CS<129:255:4>. Sector 2 is assigned every other 4 CS starting at CS<2>. In other words, sector 2 is assigned CS<2, 6, 10, . . . , 254> or CS<2: 127:4> and continuing with CS<129:255:4>. Thus, sector 3 is assigned every other 4 CS starting at CS<3>. In other words, sector 3 is assigned CS<3, 7, 11, . . . , 255> or CS<3:127:4> and continuing with CS<131:255:4>.

FIG. 9C shows an embodiment with J equal to 2. The 256 columns are divided into 2 sectors and 2 CS are selected in parallel and substantially at the same time. Sector j 360 is assigned CS<j:63:2> and continuing with CS<(j+64):127: 2>, CS<(j+128):191:2> and CS<(j+192):255:2>, where j is an integer between 0 and 1. Sector 0 is assigned every other 2 CS starting at CS<0>. In other words, sector 0 is assigned CS<0, 2, 4, . . . , 254> or CS<0:63:2>, and continuing with CS<64:127:2>, CS<128:191:2> and CS<192:255:2>. Thus, sector 1 is assigned every other 2 CS starting at CS<1>. In other words, sector 1 is assigned CS<1, 3, 5, . . . , 255> or CS<1:63:2>, and continuing with CS<65:127:2>, CS<129: 191:2> and CS<193:255:2>.

Figure 10:
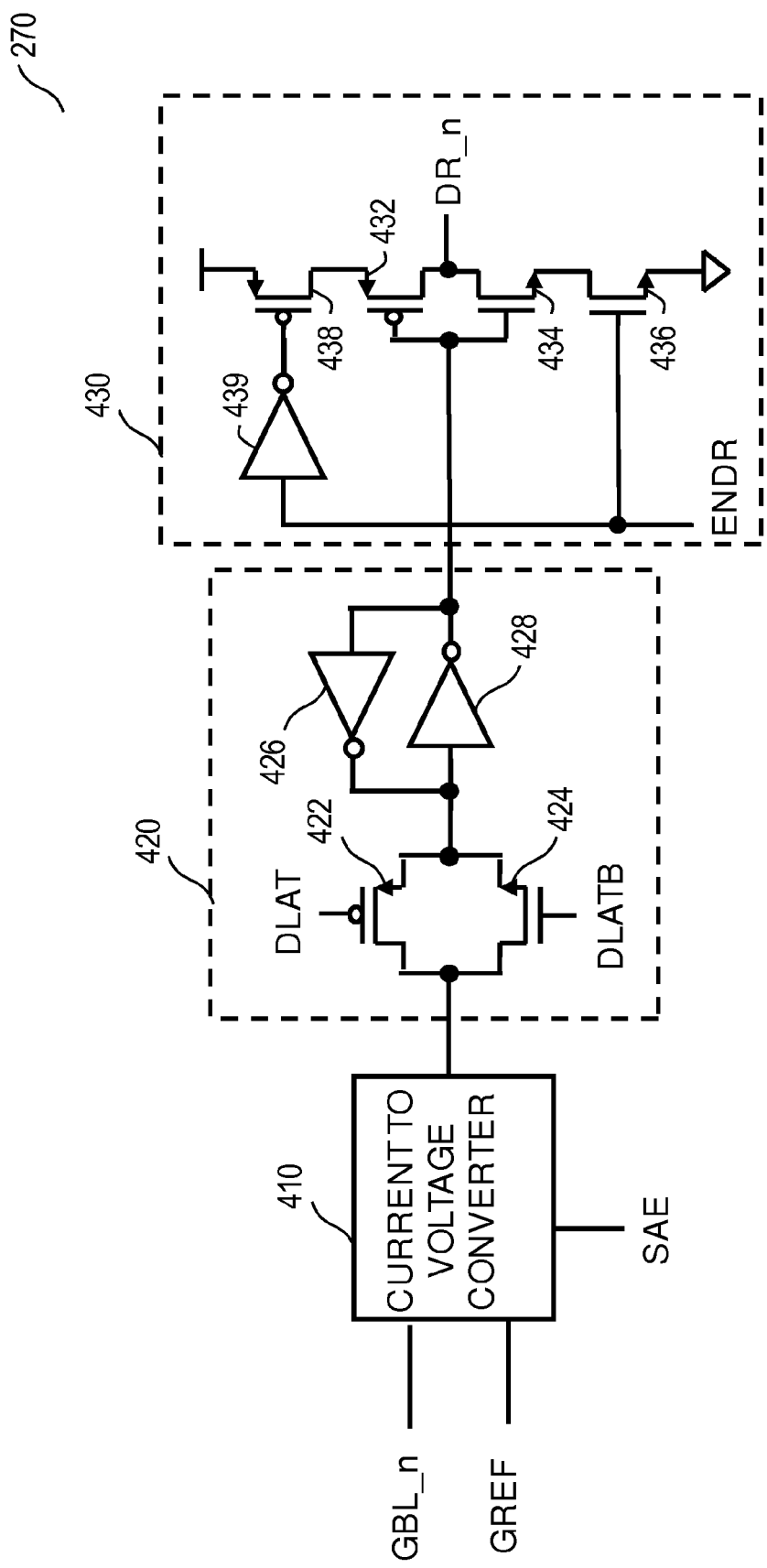
FIG. 10 is a schematic diagram of a sense amplifier output stage circuitry, in accordance with one embodiment of the inventive concept.

FIG. 10 is a schematic diagram of a sense amplifier output stage circuitry 270, in accordance with one embodiment of the inventive concept. Sense amplifier output stage circuitry 270 corresponds to SA_n 270 referenced in FIG. 8. FIG. 10 includes a current to voltage converter 410, a latch and pass gate 420 and a DR_n driver 430. GBL_n and GREF are input to the current to voltage converter 410, which senses and couples the sensed bit to latch and pass gate 420 if a SAE signal is enabled. Latch and pass gate 420 includes an analog switch coupled to a latch. The latch can include two cross coupled inverters 426 and 428. The analog switch includes p-channel transistor 422 and n-channel transistor 424 connected in parallel, which couples the sensed bit to the latch if signal DLAT is low and DLATB is high. The latch and pass gate is coupled to DR_n driver 430. DR_n driver 430 includes a CMOS inverter driver including transistors 432 and 434, which are enabled by a p-channel transistor 438 and an n-channel transistor 436 controlled by an enable driver ENDR signal. An inverter 439 is coupled to the gate of the p-channel transistor 438 and inverts the ENDR signal. Thus, during a read operation, the stored bit is sensed and latched by signals SAE, DLAT and DLATB in latch and pass gate 420, and subsequently driven onto the DR_n signal line by DR_n driver 430 if signal ENDR is enabled.

Figure 11:
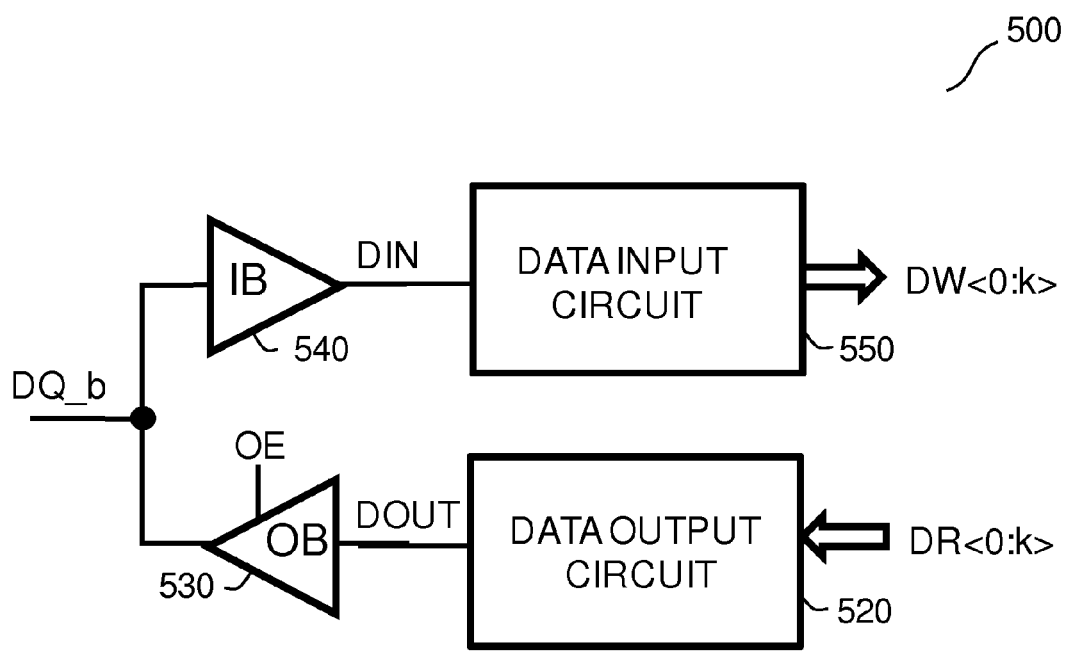
FIG. 11 is an exemplary block diagram of a data read and write circuitry, in accordance with one embodiment of the inventive concept.

FIG. 11 is an exemplary block diagram of a data read and write circuitry 500, in accordance with one embodiment of the inventive concept. Data read and write circuitry 500 includes a data output or read circuit 520, an output buffer OB 530, an input buffer IB 540 and a data input or write circuit 550. Data read and write circuitry 500 may generally be a parallel and/or serial data converter. The J DR_k lines, which carry the sensed data being read out of the NVM system are input to data output circuit 520, which converts the parallel J bits of sensed data into a serial output data burst on a data out signal DOUT. DOUT is coupled to the OB 530, which is adapted to interface to components outside the NVM system. The OB 530 drives the parallel J bits of sensed data onto a DQ_b signal. The DQ_b connection is driven by the OB 530 if an output enable OE signal coupled to the OB is enabled. Burst serial data to be written into the NVM system is burst into the DQ_b connection and is received by IB 540, which drives the data into data input circuit 550 via a data in DIN signal. Data input circuit 550 converts the serial input data stream on the DIN signal into J parallel DW_k signals. As described above, the NVM system is b bits wide so there are b separate read and write circuitry 500, and b separate global write and global SA_b 150 blocks. These b parallel data paths are each able to synchronously burst in or out J bits of serial data as explained in greater detail below.

Figure 12:
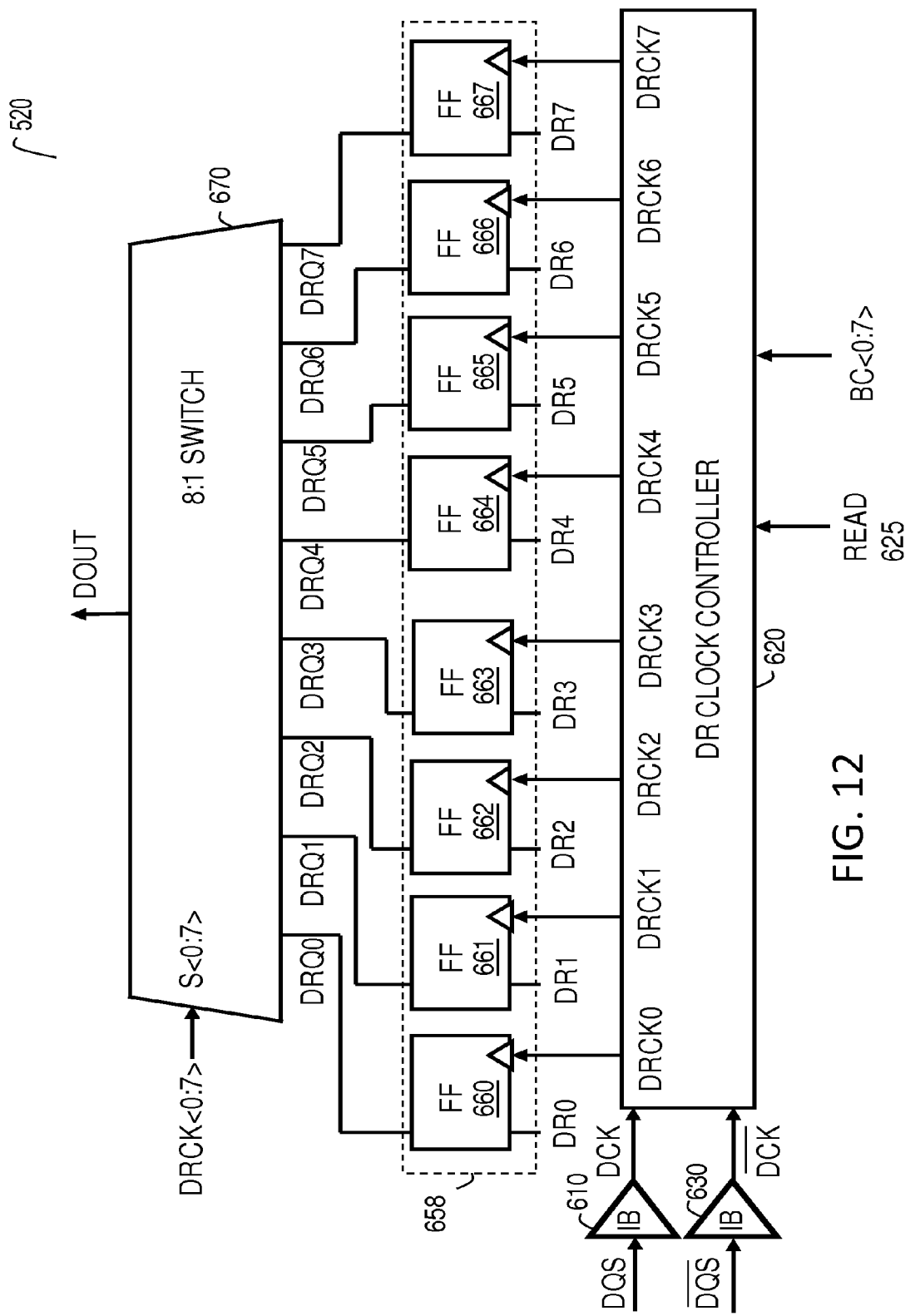
FIG. 12 is an exemplary block diagram of a data output circuit, in accordance with one embodiment of the inventive concept.

FIG. 12 is an exemplary block diagram of a data output circuit 520, in accordance with one embodiment of the inventive concept. Input buffer 610 inputs to the NVM system a DQ synchronization DQS control signal and drives a data clock DCK signal. Input buffer 630 inputs to the NVM system an inverted DQ synchronization DQSB control signal and drives a data clock DCKB signal. Data output circuit 520 (of FIG. 11) includes a DR clock controller 620, a DR register 658, and an 8:1 read switch 670. DR register 658 includes a multitude of J flip flops FF 660-667 in this J=8 example. It will be understood that the number of flip flops or latches, and related components, can be different depending on the value of J according to various embodiments.

The J flip flops FF 660-667 may latch the J DR_k data values from each of the corresponding data lines (e.g., DR0, DR1, DR2, DR3, DR4, DR5, DR6, and DR7) under the control of the corresponding J DRCK_k latch control signals from the DR clock controller. The DR clock controller can be controlled by (i) a read signal 625 from the control logic, (ii) a burst count BC<0:7> bus from the J-deep burst counter 127 in the control logic 125, and/or a data clock DCK and an inverted data clock DCKB. The DCK and DCKB signals may be generated by a phase locked loop (PLL) in the control logic 125 or otherwise generated from outside the NVM system and input via corresponding input buffers as further described below with reference to FIG. 14. Referring again to FIG. 12, the signals on the BC<0:7> bus may correspond to a selected column address and enable one corresponding DRCK_k latch control signal at a time. Each of the J DRCK<0:7> signals is coupled to a corresponding one of the S<0:7> signals inside the 8:1 read switch 670. A data switch output DOUT of the 8:1 switch transmits a DOUT signal. Once the J DR_k values are latched in the J FFs, the 8:1 read switch 670 selects one of the J DRQ_k values from the J FFs at a time to output on the DOUT signal controlled by the J DRCK_k signals on a DRCK<0:7> bus.

Since the FF 660-667 latch on a positive clock edge, data output circuit 520 may be divided into two sections. The two sections are synchronized to the non-overlapping rising edges of the DCK and DCKB clock signals, which allows the data output circuit to operate at double the frequency of either DCK or DCKB alone or in other words, it is capable of DDR performance. Thus, data output circuit 520 converts the parallel DR0-DR(k) data bits from sense amplifier output stage circuitry 270 into a serial data burst of J bits at the DQ_b output of the NVM system. The sequence order in the serial burst is controlled by the BC<0:7> from the burst counter 127, which follows the sequence described in reference to FIG. 6. For example, for burst length J=8 and the starting column address (A2, A1, A0)=(0, 1, 1), then the specified column sequence may be CS3-CS4-CS5-CS6-CS7-CS0-CS1-CS2, in that order. Thus, the first bit in the serial burst out sequence is driven out from the DRQ3 FF 663, the second bit from the DRQ4 FF 664, the third bit from the DRQ5 FF 665, and so on to the (k)th bit in the burst or DRQ7 FF 667, and then wrapping around to DRQ0 FF 660 until the last bit in the sequence, DRQ2 FF 662, is driven out from the J DR_k FFs. The serial data out burst transmits data at twice the frequency of any input clock or double the data rate of non-DDR capable circuits. In another embodiment, one DCK signal is included to synchronize the data output circuit 520 instead of both DCK and DCKB. In this embodiment, the DCK signal may burst data at the same frequency as the input clock or otherwise be compatible with a single data rate (SDR) memory.

By way of another example, when data is fetched in parallel, the data can be rearranged so that it is serialized in the correct data sequence. The read switch 670 can rearrange the DI<0:7> to the proper output sequence, which can be dependent on the start address and burst sequence. Otherwise, the data would be output in an incorrect order. For instance, during a read operation, if the burst address sequence is: 2, 3, 0, 1, then the data-out sequence can be rearranged as 0, 1, 2, 3. Moreover, by knowing the column start address and burst length, the burst sequence can be determined, and the read delay of each bit can be hidden by parallel to serial conversion. Read sensing times can be influenced by array size, process, and the like. If the read delay is eight (8) nanoseconds, for example, then 8 clock cycles are needed to read particular data (assuming 1 GHz operating frequency). However, the data can be retrieved and latched in parallel, rearranged, and output as a serial burst of data, thereby pipelining the data and hiding the actual per-memory-location read delays. In other words, in the read operation, by knowing the column start address, burst length and whether it is a linear burst or interleave burst sequence, the complete column burst address can be generated together and provided at once to the associated memory blocks (as further shown with reference to the waveforms of FIG. 16), and at the same time, the pre-fetched data can be serially clocked out according to the burst sequence. The read sensing time of the next read can occur while the first read burst data is being read, there by hiding the read delay and allowing a sustained data out bandwidth.

Figure 13B:
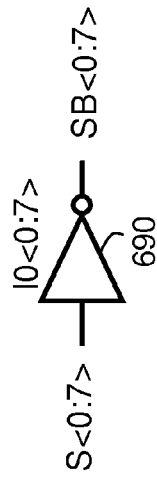
FIGS. 13A-13C are schematic diagrams of an 8:1 switch circuit, in accordance with one embodiment of the inventive concept.
Figure 13C:
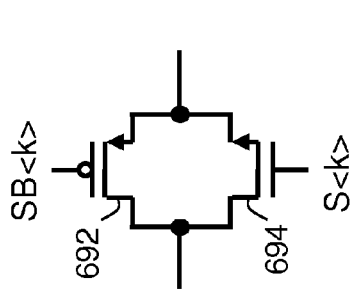
Figure 13A:
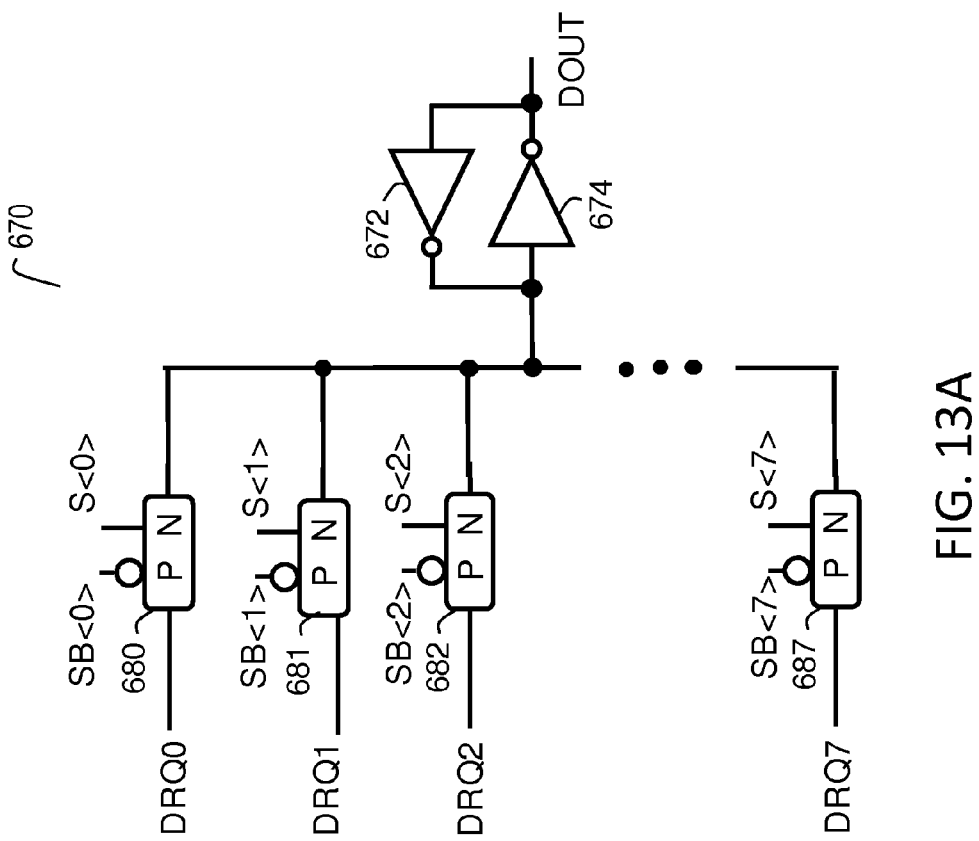

FIGS. 13A-13C are schematic diagrams of an 8:1 read switch circuit 670, in accordance with one embodiment of the inventive concept. The 8:1 read switch circuit 670 includes J analog switches 680-687 and two cross coupled inverters 672 and 674 configured as a latch. Each of the J analog switches_k is (i) coupled to a corresponding data switch (e.g., DRQ<k>) signal and (ii) enabled by corresponding switch (e.g., S<k>) and inverse-switch (e.g., SB<k>) signals. Each of the analog switches comprises a p-channel transistor 692 whose gate is enabled by a switch signal (e.g., SB<k>) and a parallel coupled n-channel transistor 694 whose gate is enabled by the switch signal (e.g., S<k>). The J SB_k signals are driven by J corresponding inverters 690 taking their input from the corresponding J SB_k switch signals. If one of the J SB_k switch signals is enabled, the corresponding analog switch couples the signal from the corresponding J DRQ_k input signals to the latch, and outputs a signal DOUT.

FIG. 14 is an exemplary block diagram of a data input circuit 550 and a multitude of input buffers IB 610 and 630, in accordance with one embodiment of the inventive concept. Data input circuit 550 includes a DINL even clock controller 720, a DINL odd clock controller 740, an even DIN register 758, an odd DIN register 759, a DI register 769, and a write switch 780. Even DIN register 758 includes a multitude of J/2 even flip flops FF 760, 762, 764 and 766 in this J=8 example. Odd DIN register 759 includes a multitude of J/2 odd flip flops FF 761, 763, 765 and 767. DI register 769 includes a multitude of J flip flops FF 770-FF 777. It will be understood that the number of flip flops or latches, and related components, can be different depending on the value of J according to various embodiments.

Burst serial data to be written to the NVM system is driven on a DIN line. The DIN line is input to the FFs 760-767. Clock signal DQS is coupled through IB 610, which drives DCK into DINL even clock controller 720. If a WRITE control signal 725 is enabled, the DINL even clock controller 720 drives even DINL_k latch control signals DINL0, DINL2, DINL4, and DINL6. The WRITE signal 725 may be a different signal than the previously discussed ENW signal for timing reasons. The DINL0, DINL2, DINL4 and DINL6 latch signals control the even DIN register 758, which latches the even DIN_k data, DIN0, DIN2, DIN4 and DIN6 into the corresponding even flip flops FF 760, 762, 764 and 768, respectively, under control of the DINL0, DINL2, DINL4 and DINL6 signals, respectively. Since the DINL_k latch control signals are synchronized to the rising DCK edge, every other bit starting with the first even bit in the burst may be latched into corresponding FFs in DIN register 758, at the appropriate time, as the data is burst in sequence on the common DIN latch input.

Similarly, clock signal DQSB is coupled through IB 630, which drives DCKB into DINL odd clock controller 740. If the WRITE signal 725 is enabled, the DINL odd clock controller 740 drives odd DINL_k latch control signals DINL1, DINL3, DINL5, and DINL7. The DINL1, DINL3, DINL5 and DINL7 latch signals control whether odd DIN register 759 latches the odd DIN_k data, DIN1, DIN3, DIN5 and DIN7 into the corresponding odd flip flops FF 761, 763, 765 and 767, respectively. Since the DINL_k latch control signals are synchronized to the rising DCKB edge, every other bit starting with the first odd bit in the burst may be latched into corresponding FFs in DIN_k register 759 at the appropriate time as it is burst in sequence on the common DIN latch input.

Since serial burst data in is transmitted at twice any externally available clock frequency and latching occurs on a rising clock edge, the data input circuit 550 is divided into even and odd circuits, each synchronized to the non-overlapping rising edges of the DQS and DQSB clock signals, respectively. The even and odd circuits alternate as they sample the serial burst input data. Thus, the serial input data is latched in the even and odd DIN_k registers, into the corresponding FFs, at the appropriate time maintaining the DIN_k bit identity corresponding to the sequence order of each bit in the serial burst. For example, the first bit in the serial burst sequence is latched in DIN0, the second bit in DIN1, the third bit in DIN3 and so on until the (k)th bit in the burst is latched in the DIN(k) FF. However, the burst sequence bit order may be reassigned based on column address via the write switch to be described later.

Other burst sequence capture bit order may be included as long as data is latched in the DIN_k FF, triggered by alternating between the DCK and DCKB signals to keep up with the DDR DIN signal. The serial data in burst on DIN transmits data at twice the frequency of any input clock or double the data rate of non-DDR capable circuits. In one embodiment, one DQS signal is included to synchronize the data input circuit 550 instead of two DQS and DQSB, which may burst data in at the same frequency as the input clock or compatible with a single data rate (SDR) memory. In another SDR embodiment, the data-in can be strobed or registered by the memory clock instead of a separate DQS signal. As discussed earlier, DCK and DCKB signals may be generated within the NVM system by a PLL in the control logic 125 instead of being furnished externally by DQS and DQSB, eliminating the need for IBs 610 and 630.

When the input data burst of J bits has finished being latched in both even DIN_k register 758 and odd DIN_k register 759, the data-in bits may be transferred in parallel from the FFs in the DIN_k registers to the corresponding FFs in the DI_k register 769 if a DILAT register control signal from the control logic is enabled. Once the data in is latched and held in DI_k register 769, both even DIN_k register 758 and odd DIN_k register 759 are free to begin sampling and latching the next J bits during back to back burst write cycles. The two stages of registers, (i) even DIN_k register 758 and odd DIN_k register 759 and (ii) DI_k register 769, enable the write time for the last bit latched to be stretched and overlap into the next J bit data in the burst cycle, and beyond the time it takes to latch the last bit in the current burst cycle. Thus, the data input circuit 550 helps to overcome the problem of memory cell write time exceeding the available time during a single data bit transmission at DDR speed.

Once the J DIN_k bits are held in DI_k register 769, they are output as J DI_k signals, which are input to corresponding DI_k inputs of write switch 780. The burst in data sequence order that is stored in the DI_k register 769 is rearranged at the DWi<0:7> bus output of write switch 780 based on the start address and burst sequence controlled by BC<0:7> as described below. The write switch 780 is controlled by the BC<0:7> bus from the control logic 125, which is coupled to the S<0:7> bus in the write switch. The output of write switch 780, bus DWi<0:7> is coupled to a register section 785, which may hold the DWi<0:7> signals for a predetermined number of clock cycles. The output of the register section 785, bus DW<0:7> is coupled to corresponding J parallel DW_k signals and input to the global R/W blocks 150 described in reference to FIG. 8.

Figure 15:
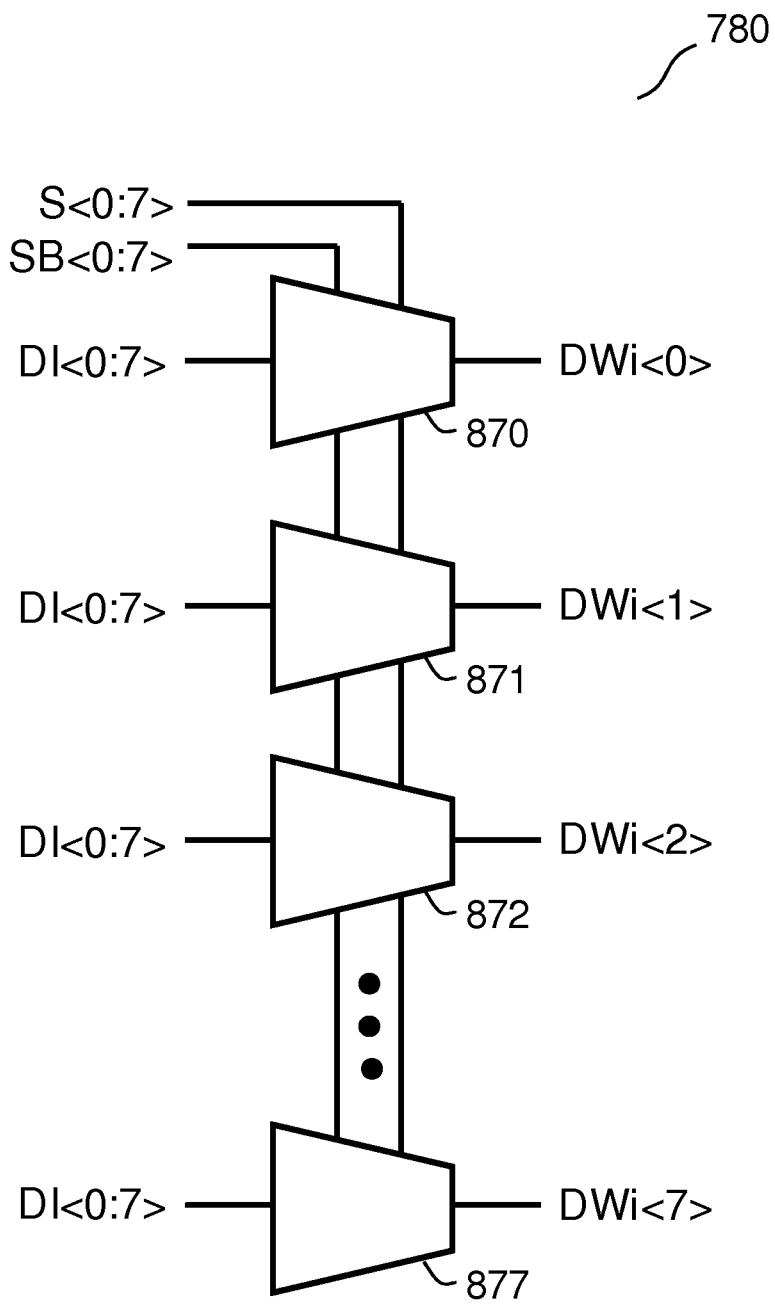
FIG. 15 is an exemplary block diagram of a write switch, in accordance with one embodiment of the inventive concept.

FIG. 15 is an exemplary block diagram of a write switch 780, in accordance with one embodiment of the inventive concept. Write switch 780 includes J switches 870-877 connected in parallel. Each of the J switches 870-877 corresponds to 8:1 read switch 670 described in reference to FIGS. 13A-13C and includes a latch at the output of each switch. Referring again to FIG. 15, the inputs to the J switches 870-877 are coupled in parallel to input bus DI<0:7>. For example, the DI0 signal is coupled to the DI0 input of each of the J switches 870-877, the DI1 signal is coupled to the DI1 input of each of the J switches 870-877, and so forth. Each of the J switches 870-877 separately output corresponding J DWi_k signals DWi<0>-DWi<7>. For example, switch 870 outputs DWi<0>, switch 877 outputs DWi<7>, and so forth. The J switches 870-877 are controlled by the S<0:7> bus and the SB<0:7> bus.

The data input on DI0-DI7 may be reassigned based on column address via the write switch 780. One of the S<0:7> signals is enabled at a time based on the starting column address. The S<0:7> and SB<0:7> bus connections within each of the J switches 870-877 are adapted to output the bit sequence described in FIG. 6. For example, referring again to FIG. 15, the DI_k (of FIG. 14) are passed through the switch 780 without rearranging if S<0> is enabled, such that DI0 is latched to DWi<0>, DI1 is latched to DWi<2>, and through DI(k) latched to DWi<k>. However, if S<3> is enabled and J=8, for example, which corresponds to starting column address (A2, A1, A0)=(0, 1, 1), then the specified column sequence may be CS3-CS4-CS5-CS6-CS7-CS0-CS1-CS2 in that order. Thus, the DI_k are passed through the switch with rearranging such that DI0 is latched to DWi<5>, DI1 is latched to DWi<6>, DI2 is latched to DWi<7>, DI3 is latched to DWi<0>, DI4 is latched to DWi<1>, DI5 is latched to DWi<2>, DI6 is latched to DWi<3>, DI7 is latched to DWi<4>, and so forth. Thus, the J switches 870-877 rearrange the data on DI<0:7> into starting column address order on DWi<0:7> in parallel. As previously mentioned, the DWi<0:7> is held by the register section 785, which provides the DW<0:7> data.

By way of another example, the switch 780 steers the DI<0:7> to the proper column address, which can be dependent on the start address and burst sequence. Otherwise, the data would be stored in the wrong columns. When sequential data is received, it is rearranged so that the data is written to the correct address. For instance, during a write operation, if the burst address sequence is: 2, 3, 0, 1 and the data-in is 0, 1, 2, 3, then DI<0> can be mapped to DW<2>, DI<1> can be mapped to DW<3>, DI<2> can be mapped to DW<0>, DI<3> can be mapped to DW<1>. The DW<0:3> represent the physical location, or in other words, the DW<0:3> data is associated with the physical DW_k lines for the memory array. Moreover, by knowing the column start address and burst length, the burst sequence can be determined, and the write delay of each bit can be hidden by serial to parallel conversion. If the write delay is four (4) nano-seconds, for example, then 4 clock cycles are needed to write particular data (assuming 1 GHz operating frequency). However, in a write operation, the incoming serial burst data can be retrieved and latched, rearranged, and transmitted in parallel to the appropriate memory locations simultaneously over the burst length period, thereby extending the write pulse. In other words, in the write operation, by knowing the column start address, burst length and whether it is a linear burst or interleave burst sequence, the complete column burst address can be generated together and provided at once to the associated memory blocks (as further shown with reference to FIG. 17), and the coming serial data can be latched and re-routed according to the physical address burst sequence to write in a parallel fashion over the entire burst length period, thereby extending the write.

Figure 16:
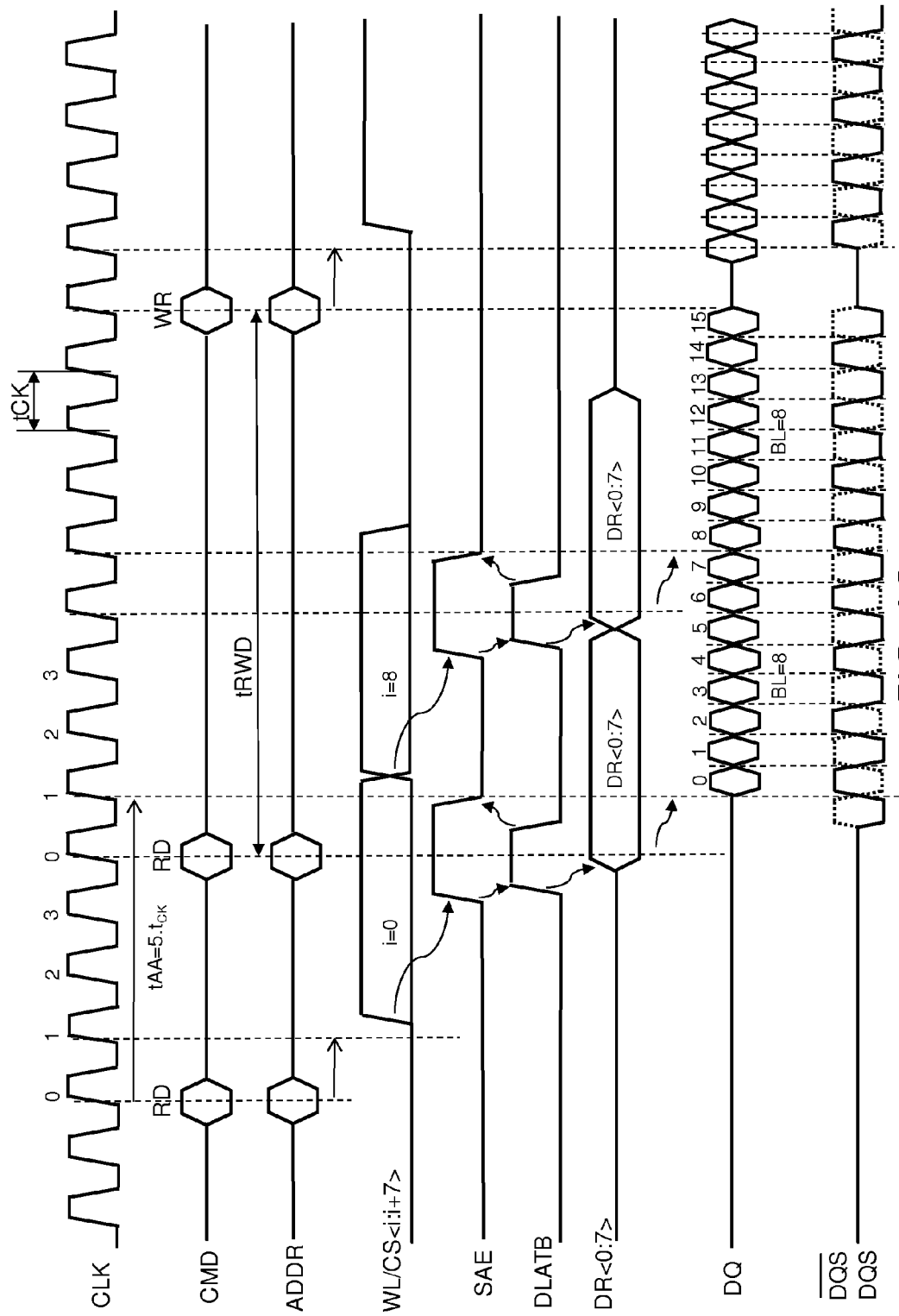
FIG. 16 is an exemplary timing diagram of a number of signals associated with the NVM system and associated circuitry of FIGS. 7 and 11 during back-to-back burst-read operations.

FIG. 16 is an exemplary timing diagram of a number of signals associated with the NVM system and associated circuitry of FIGS. 7 and 11 during back-to-back burst-read operations. In some embodiments, the non-volatile memory array and methods may be compatible with double data rate, single data rate, or other high speed serial burst operation. The timing signals in FIG. 16 include clock signal CLK, command signal CMD, address signal ADDR, data synchronization signals DQS and DQSB, and data in signal DQ for a conventional DDR SDRAM with J=8. FIG. 16 also includes SAE, WL, CS<i:i+7>, DLATB, and DR<0:7> signals for operations of the NVM system described above in connection with FIG. 7-FIG. 13 for the operation of the non-volatile memory in accordance with embodiments of the inventive concept.

A read RD command and address are registered by the NVM system at the rising edge of the first CLK cycle of the first burst read cycle. The M SA_n associated with each global R/W block 150 are enabled by SAE during the next CLK cycle while address information is decoded. Next, a selected WL is driven high and J of the selected CS signals, CS<i:i+7> are enabled based on the burst start address according to FIG. 9A, since J=8 in this example. Referring again to FIG. 16, shortly afterwards, the DLATB signal is controlled by the control logic to latch the bits in the output circuits 270 and make the DR<0:7>, in this example, available to the data output circuit as described in connection with FIG. 10-FIG. 13. Referring again to FIG. 16, shortly afterwards and following the first DQS and DQSB clock signal transition, the first data out bit DR0 is driven on the DQ output line followed by the remainder of the J bits in the serial burst at the rising and falling edges of the clock as described in connection with FIG. 12. Referring again to FIG. 16, the access time, tAA, for the NVM system from beginning of the first read cycle to first bit burst out is 5 CLK periods.

The next burst read cycle may start immediately on the fourth CLK cycle following the first burst read cycle. The second burst read cycle may be started before the data from first cycle starts to burst out. Thereafter sequential bits are burst out at twice the CLK frequency. There is no limit to how many back-to-back burst reads may be executed. Back-to-back burst read commands may be accommodated continuously until all the required data is read out. The next back-to-back burst read cycle can start, for example, after a predetermined number of clock cycles after the start of the previous read cycle. The predetermined number of clock cycles can be, for example, equal to or greater than the burst length J for single data rate (SDR) burst operation, or equal to or greater than J divided by 2 for a double data rate burst operation (DDR), in a non-volatile memory. For example, for a burst length of 8, or in other words, where J=8, during a DDR read operation, the eight memory cell read time can be extended by four (4) clock cycles, as shown with reference to the CMD and ADDR waveforms and associated timing and related waveforms in FIG. 16. As previously explained above, the read delay of each bit is hidden by parallel to serial conversion. It is noted that the last read cycle is followed by a delay time before a subsequent write cycle, tRWD to allow time for the last bit to burst out on DQ before the control logic may respond to the new WR command without data truncation loss. In some embodiments of the inventive concept, back-to-back read bursts of data are sustained such that multiple back-to-back bursts of data are provided. In some embodiments of the inventive concept, if the read delay is longer than the burst length period, then one or more NOP cycles (not shown) can be inserted between read bursts.

Figure 17:
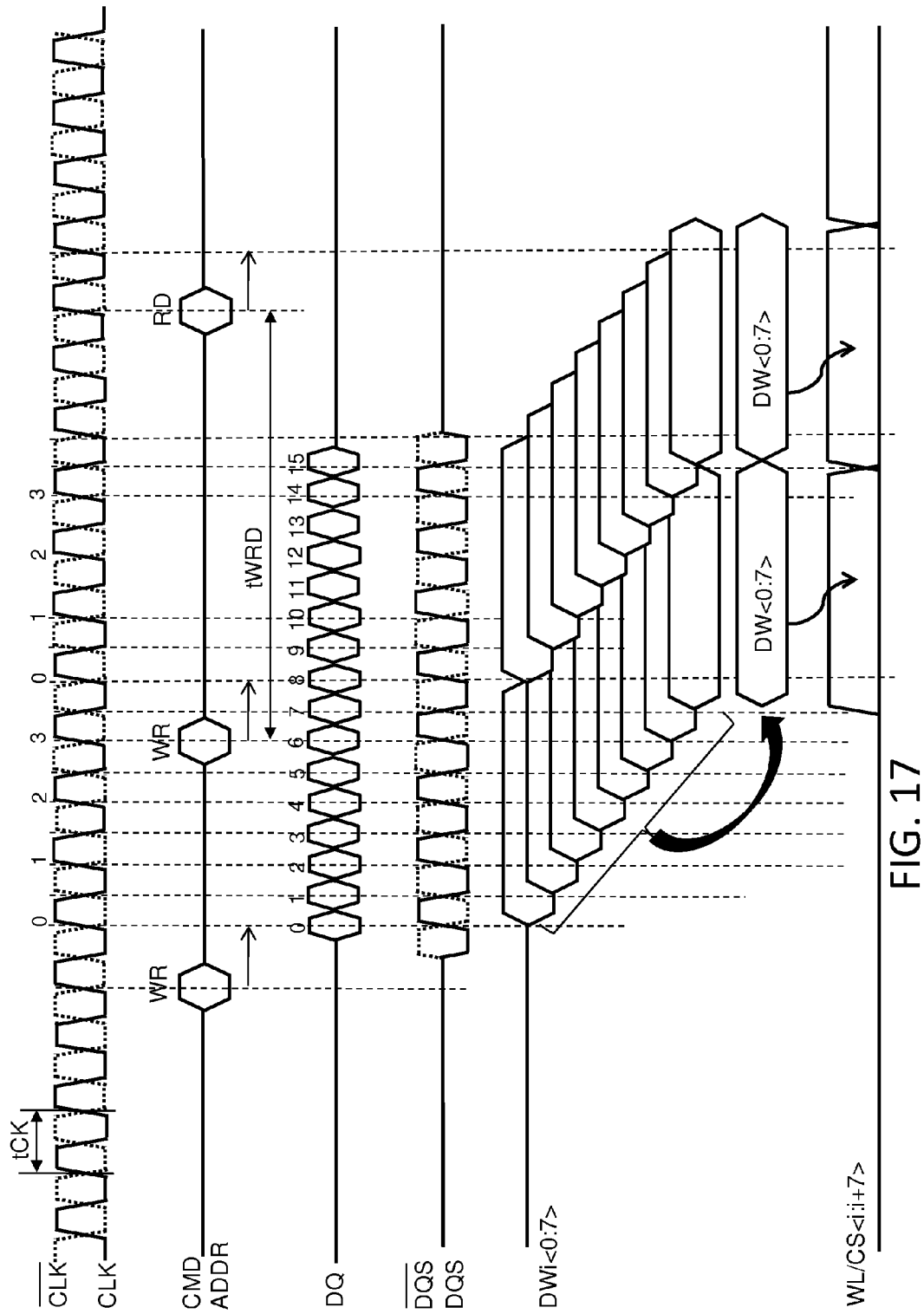
FIG. 17 is an exemplary timing diagram of a number of signals associated with the NVM system and associated circuitry of FIGS. 7 and 11 during back-to-back burst-write operations.

FIG. 17 is an exemplary timing diagram of a number of signals associated with the NVM system and associated circuitry of FIGS. 7 and 11 during back-to-back burst-write operations. FIG. 17 includes signals CLK, CMD, ADDR, DQ, DQS and DQSB as described above with reference to FIG. 16 for the operation of a conventional DDR SDRAM with J=8. FIG. 17 also includes DIN<0:7>, WL, and CS<i:i+7> signals for operations of the NVM system described above in connection with FIG. 7-FIG. 9, FIG. 11, and FIG. 13-FIG. 15, for the operation of the non-volatile memory in accordance with embodiments of the inventive concept.

A write WR command and address are registered by the NVM system at the rising edge of the first CLK cycle of the first burst write cycle. While address information is decoded, following the first DQS and DQSB clock signal transition, the first data in bit DQ0 in the burst sequence is sampled and latched in corresponding DIN0 FF, followed by the remainder of the J bits in the serial burst, which are sampled and latched into their corresponding DIN(k) FF at the rising and falling edges of the clock, i.e. at DDR speed, as described in connection with FIG. 14. Referring again to FIG. 17, a selected WL is driven high and J of the selected CS signals, CS<i:i+7> are enabled based on the burst start address according to FIG. 9A, since J=8 in this example. Referring again to FIG. 17, shortly after the last bit of the serially burst J bits is latched, (i) the DILAT signal transfers the J DIN_k bits to the DI_k register, (ii) the write switch rearranges and latches the J bits according to DDR starting column address order to make the DWi<0:7>, in this example, available to the register section, which holds the DWi<0:7> data for a predetermined number of clock cycles, and which then makes available the DW<0:7> to the data input circuit as described in connection with FIG. 14. The J DW_k bits may then be written in parallel to the selected columns as described in connection with FIG. 7-FIG. 8. It is noted that the write time for all the bits is similar and approximately equal to the length of time required to clock in all 8 bits of the burst since all the DW<0:7> are latched by the previously described dual register latching method. This enables the next back-to-back write cycle to start while the data from the first write cycle is still being written. The minimum write time for the NVM system is 4 CLK periods.

The next burst write cycle may start immediately on the fourth CLK cycle following the first burst write cycle. The second burst write cycle may be started before the data from first cycle starts to write into the MAT. Thereafter sequential bits are burst in at twice the CLK frequency. There is no limit to how many back-to-back burst writes may be executed. Back-to-back burst write commands may be accommodated continuously until all the required data is written into the memory. The next back-to-back burst write cycle can start, for example, after a predetermined number of clock cycles after the start of the previous write cycle. The predetermined number of clock cycles can be, for example, equal to or greater than the burst length J for single data rate (SDR) burst operation, or equal to or greater than J divided by 2 for a double data rate burst operation (DDR), in a non-volatile memory. For example, for a burst length of 8, or in other words, where J=8, during a DDR write operation, the eight memory cell write time can be extended by four (4) clock cycles, as shown with reference to the CMD and/or ADDR waveforms and associated timing and related waveforms in FIG. 17. As previously explained above, the write delay of each bit is hidden by serial to parallel conversion. It is noted that the last write cycle is followed by a delay time tWRD before a subsequent read cycle, to allow time for the last burst of data-in to be written before the control logic may respond to the new RD command. In some embodiments of the inventive concept, back-to-back write bursts of data are sustained such that multiple back-to-back bursts of data are written to memory. In some embodiments of the inventive concept, if the burst length period is shorter than the memory write time requirement, then one or more NOP cycles (not shown) can be inserted between write bursts, or alternatively, the effective write time can be reduced to accommodate back-to-back write operation.

Figure 18:
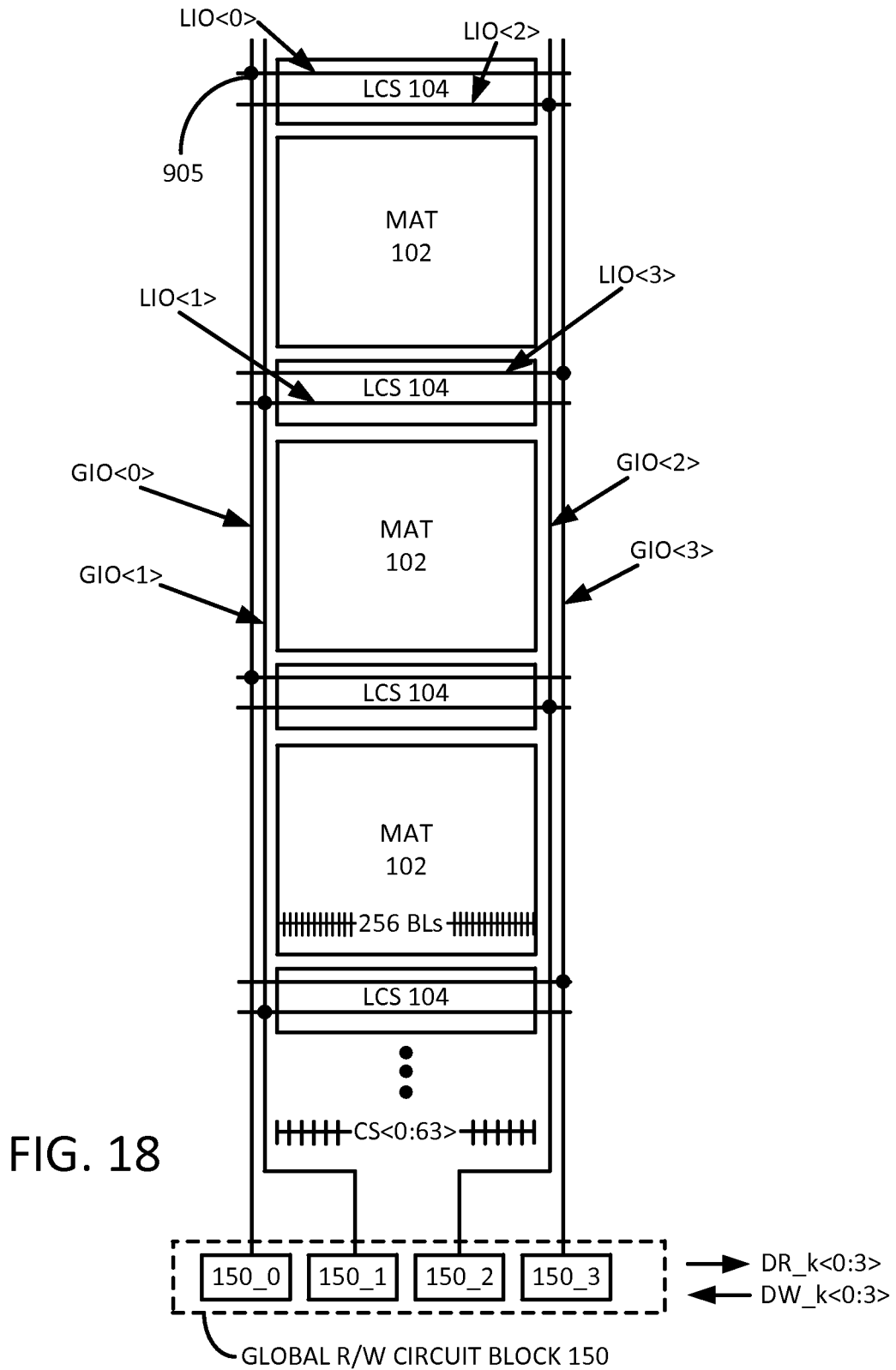
FIG. 18 is an exemplary block diagram of a portion of an NVM system in accordance with one embodiment of the inventive concept.

FIG. 18 is an exemplary block diagram of a portion of an NVM system in accordance with one embodiment of the inventive concept. Multiple MATs 102 are disposed substantially adjacent one to another. LCS 104 blocks are interposed between the MATs 102, as previously described above with reference to FIG. 7. Local input/ouput (LIO) lines connect each LCS 104 to global input/output (GIO) lines via a switch (e.g., 905). For example, LIO<0> connects a first LCS 104 to GIO<0> and LIO<1> connects a second LCS 104 to GIO<1>. Similarly, LIO<2> connects the first LCS 104 to GIO<2> and LIO<3> connects the second LCS 104 to GIO<3>. Each of the GIO lines are coupled to a corresponding one of the global R/W circuit sub-blocks 150. More specifically, GIO<0> is coupled to global R/W circuit sub-block 150_0, GIO<1> is coupled to global R/W circuit sub-block 150_1, GIO<2> is coupled to global R/W circuit sub-block 150_2, and GIO<3> is coupled to global R/W circuit sub-block 150_3. The global R/W circuit sub-blocks 150_0, 150_1, 150_2, and 150_3 may each include one or more sense amplifiers (e.g., 270, 280) and are common to all or substantially all of the MATs 102 associated with a given sub-array block of MATs, as further described below.

The LIO lines can correspond to, for example, the MBL and MSL lines discussed with reference to FIG. 8. In some embodiments, 256 bit lines (BLs) are associated with each MAT 102 and LCS 104. Global column select lines CS<0:63> can be used to simultaneously select or otherwise activate the 256 BLs. For example, each column select line can select four BLs, and if such is the case, then M is equal to four. In other words, when a particular column select line is asserted, and a particular word line is also asserted, a first BL is coupled to LIO<0>, a second BL is coupled to LIO<1>, a third BL is coupled to LIO<2>, and a fourth BL is coupled to LIO<3>. In this manner, four (4) bits of data can be read from or written to memory cells associated with each of the selected BLs. The 4 bits of data can correspond to DR_k<0:3> in connection with a burst read operation or DW_k<0:3> in connection with a burst write operation, which are associated with data transmitted over the DQ_b line of FIG. 11 and/or portions of the data shown with reference to the DQ waveforms of FIGS. 16 and 17.

Because of the non-volatile nature of MRAM cells, fewer sense amplifiers are needed. That is, there need not be a sense amplifier associated with each LIO line. Rather, each global R/W circuit block can include a smaller and more efficient sense amplifier, which can process bit information on a more global basis. Any predetermined burst sequence can be implemented. Moreover, prefetching data more closely correlates to the amount of data actually needed because rather than bursting large amounts of data that might ultimately go unused or wasted, the process can be more tightly controlled, and only the data that is needed can be prefetched and pipelined. For example, if only eight (8) bits are needed, using the inventive concepts disclosed herein, an entire memory page such as an 8K memory page need not be accessed as with conventional DRAM memory. Power consumption is therefore advantageously reduced while maintaining high bandwidth.

In an alternative embodiment, each LIO line can be coupled to a local sense amplifier. For higher bandwidth operation, the number of sense amplifiers can be increased. For example, 4 or 8 bit lines can be switched or otherwise multiplexed to one (1) sense amplifier within an LCS. By way of another example, the output of such local sense amplifiers can drive the GIO lines to one or more secondary sense amplifiers disposed in an area outside of or spaced apart from the other components of the memory block such as the MATs, LCS sections, array gaps, and so forth.

Figure 19:
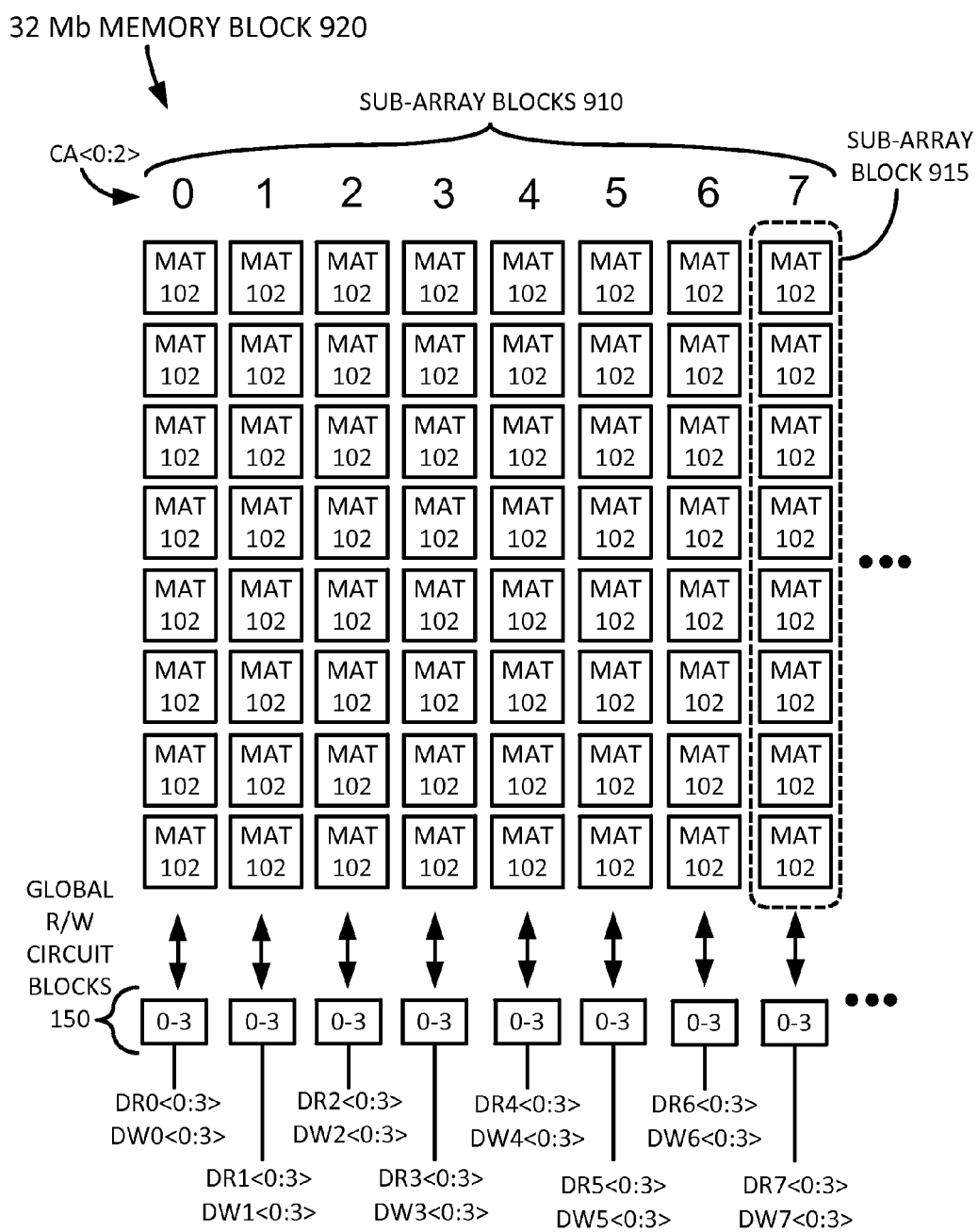
FIG. 19 is an exemplary block diagram of a 32 Mb memory block divided into sub-array blocks in accordance with one embodiment of the inventive concept.
Figure 20:
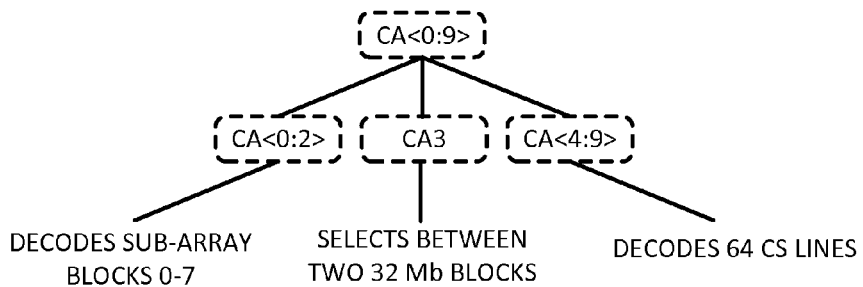
FIG. 20 shows a column address and associated functions in accordance with one embodiment of the inventive concept.

FIG. 19 is an exemplary block diagram of a 32 Mb memory block 920 divided into sub-array blocks 910 in accordance with one embodiment of the inventive concept. FIG. 20 shows a column address and associated functions in accordance with one embodiment of the inventive concept. Reference is now made to FIGS. 19 and 20.

Each sub-array block can include multiple MATs 102. For example, the sub-array block 915 includes eight (8) MATs 102. In this example, the sub-array blocks 910 are numbered from 0 to 7, each of which stores 4 Mb of data, and together form the 32 Mb memory block 920. Multiple global R/W circuit blocks 150 are associated with the sub-array blocks 910. For example, four (4) global R/W circuit sub-blocks (i.e., 0-3) can be associated with each individual sub-array block. The first three address bits, i.e., CA<0:2>, of a column address (e.g., CA<0:9> shown in FIG. 20) can be used to decode or otherwise select an individual sub-array block 0, 1, 2, 3, 4, 5, 6, or 7 from among the sub-array blocks 910. The sub-array block 0 may be associated with DR0<0:3> in connection with a read operation and DW0<0:3> in connection with a write operation. The sub-array block 1 may be associated with DR1<0:3> in connection with a read operation and DW1<0:3> in connection with a write operation, and so forth. Thus, the sub-array block 7 may be associated with DR7<0:3> in connection with a read operation and DW7<0:3> in connection with a write operation. Further techniques for accessing MRAM data in bursts is further discussed in detail below.

Figure 21:
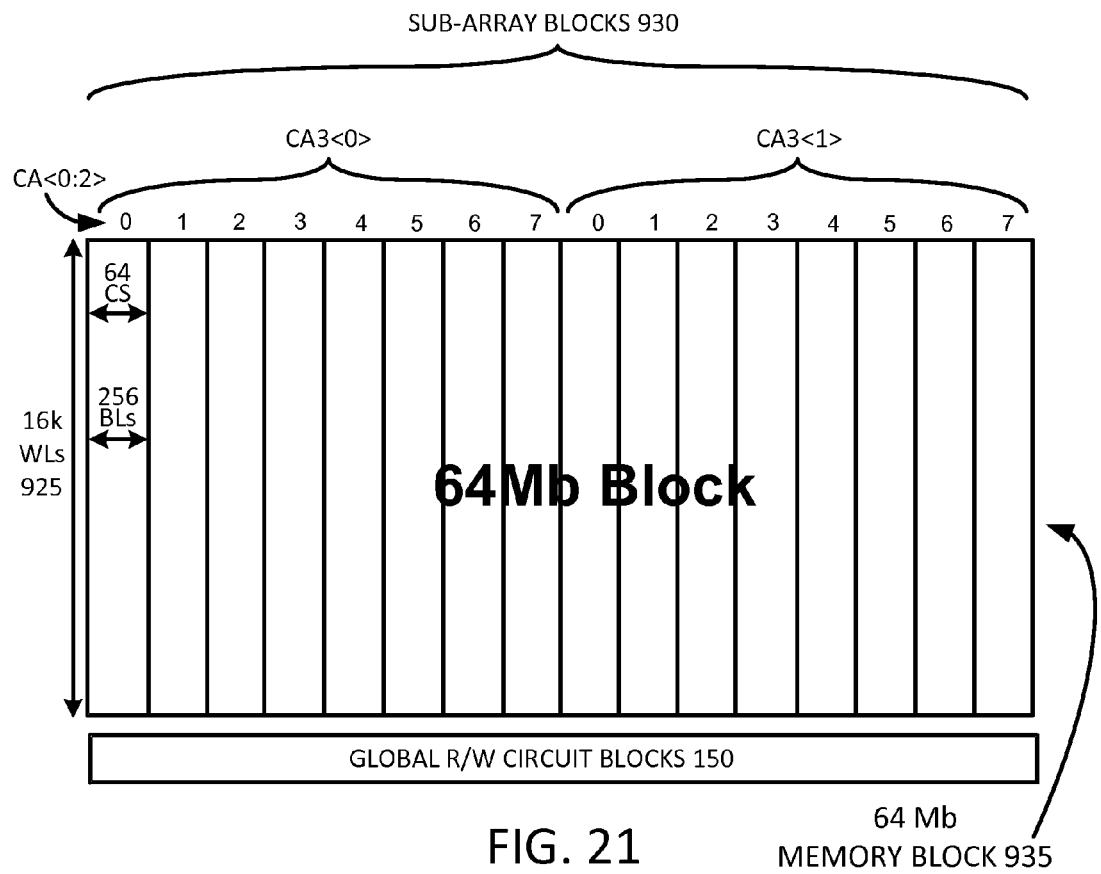
FIG. 21 is an exemplary block diagram of a 64 Mb memory block divided into sub-array blocks in accordance with one embodiment of the inventive concept.

FIG. 21 is an exemplary block diagram of a 64 Mb memory block divided into sub-array blocks in accordance with one embodiment of the inventive concept. Reference is now made to FIGS. 20 and 21.

Multiple 32 Mb memory blocks can be combined to form larger memory blocks such as the 64 Mb memory block 935. The 64 Mb memory block 935 includes sub-array blocks 930, which are divided into 0-7 sub-array blocks of a first 32 Mb memory block and 0-7 different sub-array blocks of a second 32 Mb memory block. A fourth address bit of the column address, i.e., CA3, can be used to select between the two 32 Mb memory blocks. In other words, a value of CA3<0> can indicate a selection of the first 32 Mb memory block and a value of CA3<1> can indicate a selection of the second 32 Mb memory block.

Fifth through tenth address bits of the column address, i.e., CA<4:9>, can decode or otherwise select one or more of the 64 CS lines in each sub-array block. In some embodiments, 16 k word lines (WL) 925 are associated with each 32 Mb and/or 64 Mb memory block. As previously mentioned, address bits CA<0:2> can be used to select the individual sub-array blocks, address bit CA3 can be used to select the individual 32 Mb memory blocks, and address bits CA<4:9> can be used to select the individual CS lines. When a WL 925 is selected in combination with the selected 32 Mb memory block, sub-array block, and CS line, four bits of data can be accessed or otherwise transmitted over four corresponding BLs to four corresponding GIO lines, which are each associated with a corresponding global R/W circuit block 150.

Figure 22:
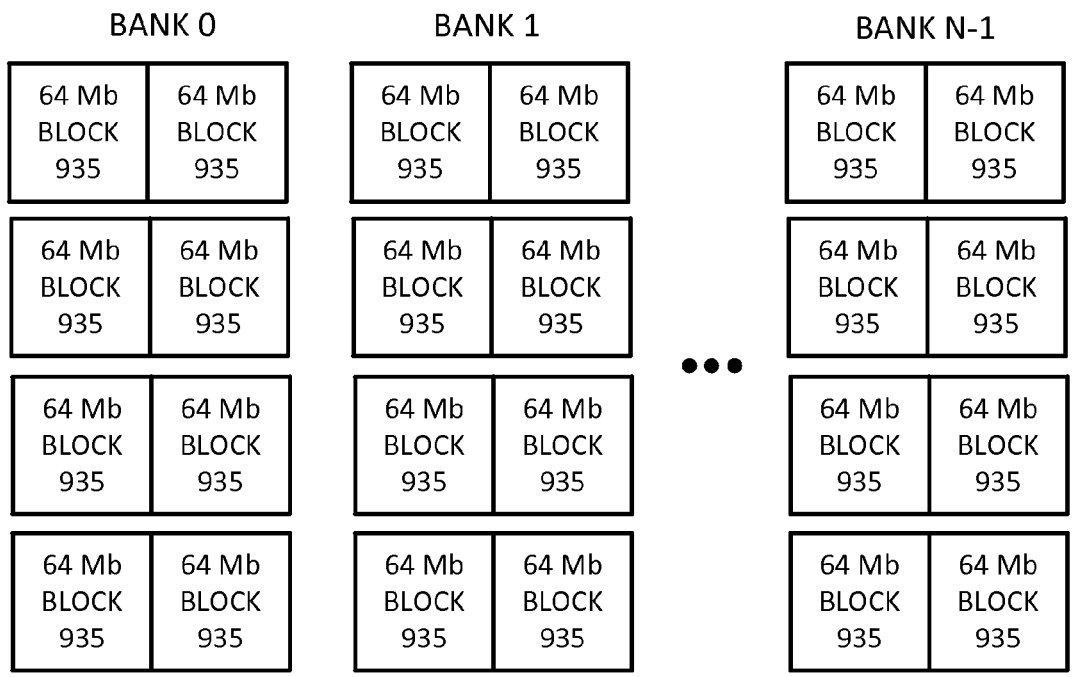
FIG. 22 is an exemplary block diagram of multiple banks of 64 Mb memory blocks in accordance with one embodiment of the inventive concept.

FIG. 22 is an exemplary block diagram of multiple banks of 64 Mb memory blocks in accordance with one embodiment of the inventive concept. Each bank can include eight (8) 64 Mb memory blocks 935. Up to N-1 banks can be combined on a single memory chip or device, where N is the number of banks, and banks are numbered from 0 to N-1. For example, a 4 Gb memory chip or device can be produced where N=8. It will be understood that N can be any suitable number, which can correspond to any suitable NVM memory chip or device size.

Figure 23:
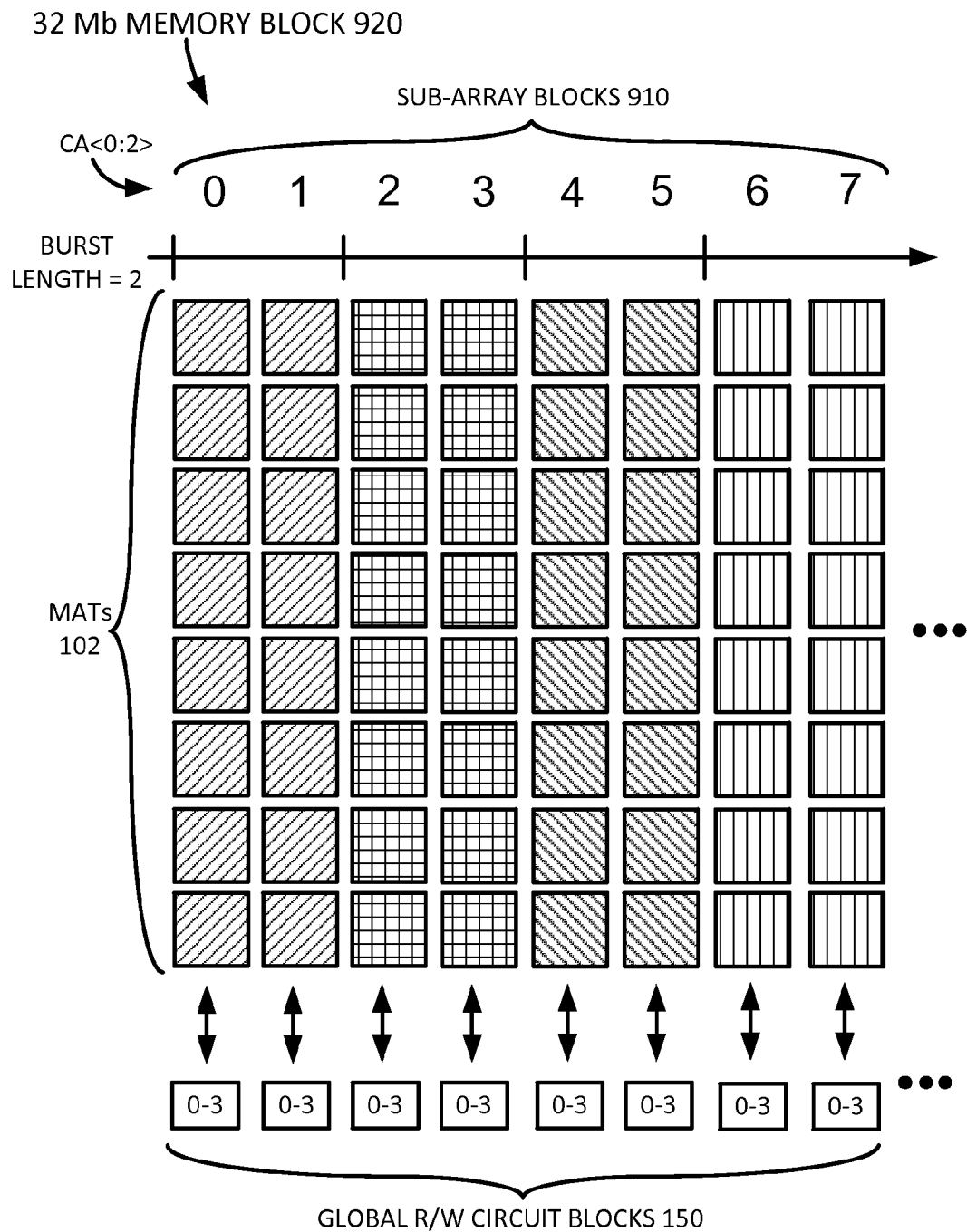
FIG. 23 is an exemplary block diagram of sub-array blocks associated with a memory burst where the burst length is 2 in accordance with one embodiment of the inventive concept.

FIG. 23 is an exemplary block diagram of sub-array blocks associated with a memory burst where the burst length is two (2) in accordance with one embodiment of the inventive concept. As shown in FIG. 23, the sub-array blocks 910 can be grouped together in pairs, as indicated by the different hatching of the MATs 102. For block activation, where the burst length is 2, the first address bit (or least significant address bit) of the column address, e.g., CA0, can be ignored, which can cause two sub-array blocks to be activated for a given burst. Nevertheless, all three address bits CA<0:2> can be used to decode the start address, determine the burst sequence, and/or determine burst boundaries.

Figure 24:
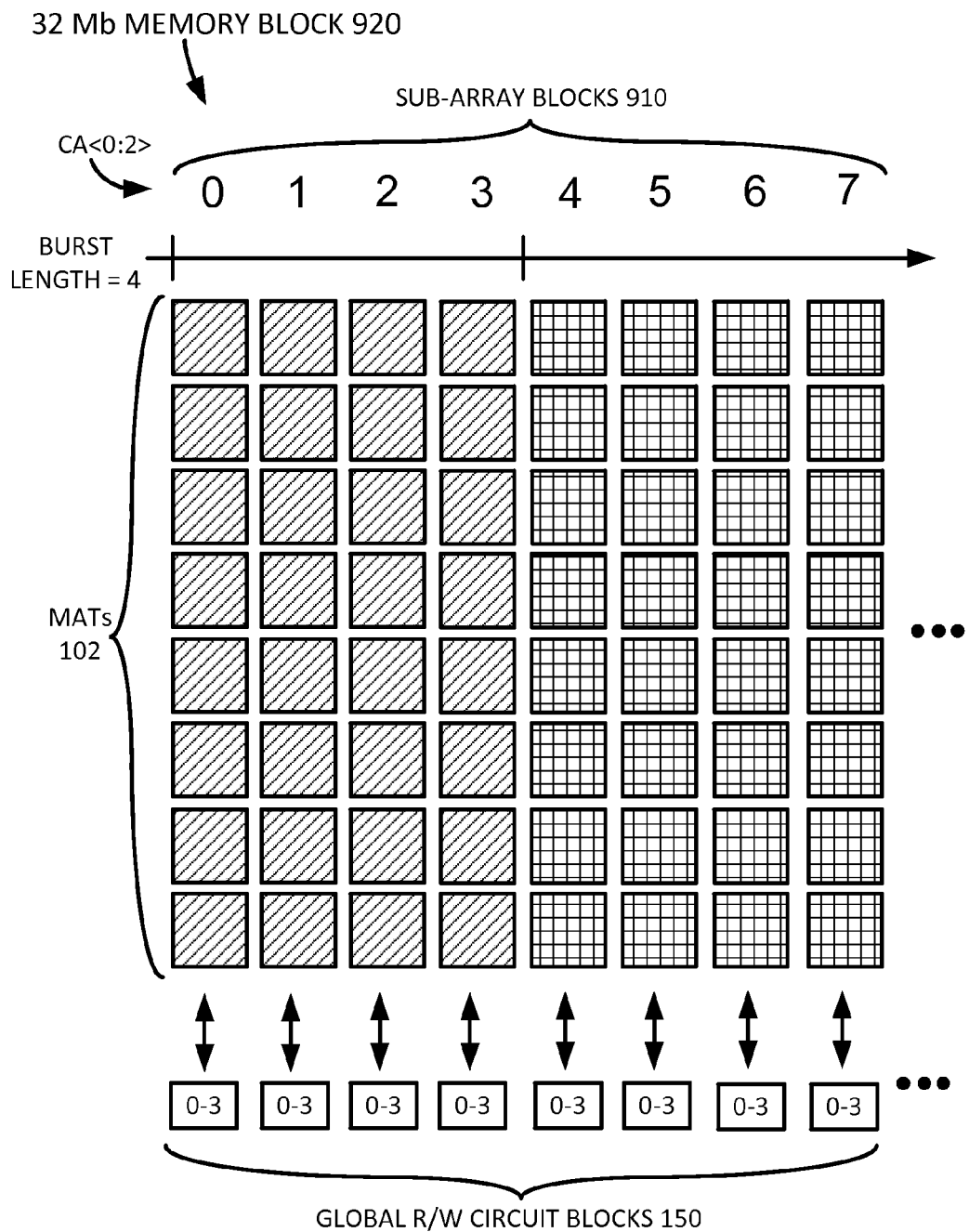
FIG. 24 is an exemplary block diagram of sub-array blocks associated with a memory burst where the burst length is 4 in accordance with one embodiment of the inventive concept.

FIG. 24 is an exemplary block diagram of sub-array blocks associated with a memory burst where the burst length is four (4), or in other words where J=4, in accordance with one embodiment of the inventive concept. As shown in FIG. 24, the sub-array blocks 910 can be grouped together in groups of four, as indicated by the different hatching of the MATs 102. For block activation, where the burst length is 4, the first two address bits (or least significant two address bits) of the column address, e.g., CA<0:1>, can be ignored, which can cause four sub-array blocks to be activated for a given burst. Nevertheless, all three address bits CA<0:2> can be used to decode the start address, determine the burst sequence, and/or determine burst boundaries.

Configurations having higher burst lengths are also provided. For example, where the burst length is eight (8), or in other words where J=8, address bits CA<0:2> can be ignored for block activation, and all eight sub-array blocks (i.e., sub-array blocks 0-7) for a given 32 Mb memory block can be activated. Nevertheless, these address bits of the column address can be used to decode the start address, determine the burst sequence, and/or determine burst boundaries.

For a burst length of sixteen (16), or in other words where J=16, address bit CA3 can be ignored for block activation. In this example, 64 sense amplifiers (i.e., 4 sense amplifiers associated with each global R/W circuit block, where 16 global R/W circuit blocks are used in connection with a burst length of 16) can be simultaneously activated. In the case of a read operation, for example, the output of the J global R/W circuit blocks (e.g., DR0, DR1, . . . , DRk, etc.) can be multiplexed to a single DQ such as DQ0, DQ1, . . . , DQk, respectively.

It will be understood that more bits can be prefetched by reconfiguring the column address. While the description herein focuses on burst lengths of 2, 4, 8, and 16, it will be understood that the inventive concepts disclosed herein can be applied to any suitable burst length. It will also be understood that where a large amount of prefetch is needed, the burst length can be increased. By prefetching only what is needed, or what is otherwise substantially needed, the MRAM memory device is more efficient, consumes less power, and at the same time, maintains high bandwidth for bursting and pipelining the data. Embodiments of the inventive concept disclosed herein enable high bandwidth operation similar to DRAM page mode burst operation, but without reading the entire page as in the case of DRAM. The efficiency of the memory array is increased and die space is saved by locating the current sense amplifiers outside the memory array block so that they are shared with an entire memory block. Moreover, power savings up to 1000 times can be realized. Thus, the MRAM device can be used as a DRAM replacement.

The above embodiments of the inventive concept are illustrative and not limitative. Various alternatives and equivalents are possible. The embodiments of the inventive concept are not limited by the type or the number of the magnetic random access memory cells included in a memory array. Nor are the embodiments of the inventive concept limited by the number of bits in a burst of serial data. The embodiments of the inventive concept are not limited by the type of transistor, PMOS, NMOS or otherwise, included to select a magnetic tunnel junction device. The embodiments of the inventive concept are not limited by the type of logic gates, NOR or NAND included to implement logical column selection. The embodiments of the inventive concept are not limited by the type of integrated circuit in which the inventive concept may be disposed. Nor are the embodiments of the inventive concept limited to any specific type of process technology, e.g., CMOS, Bipolar, or BICMOS that may be included to manufacture a memory. The embodiments described herein have been directed to memory correction circuits but are not limited thereto. The embodiments described herein may be included wherever writing and sensing data in memory cells is subject to lengthy sense and/or write time or for improving memory performance may be found useful.

What is claimed is:

1. A method for enabling higher data bandwidth in resistive type non-volatile random access memory circuits, the method comprising:
synchronously latching a first serial burst having a first plurality of bits;
storing the first plurality of bits in parallel to a first plurality of non-volatile memory cells;
receiving a second plurality of bits in parallel stored in a second plurality of non-volatile memory cells;
synchronously providing the second plurality of bits as a second serial burst;
receiving a clock signal;
receiving an inverted clock signal;
generating a first plurality of latch control signals responsive to the clock signal;
generating a second plurality of latch control signals responsive to the inverted clock signal;
latching, by a first plurality of latches, every other bit starting with the first even bit in the first serial burst;
latching, by a second plurality of latches, every other bit starting with the first odd bit in the first serial burst;
receiving, by a register, the latched bits in parallel from the first plurality of latches and the second plurality of latches responsive to a register control signal;
receiving, by a write switch, the bits in parallel from the register;
rearranging the order of the bits based on a predefined burst sequence; and
outputting the rearranged bits in parallel to a global write and sense amplifier block.

2. The method of claim 1, further comprising:
synchronously latching a first half of the first plurality of bits in the first serial burst responsive to the first plurality of latch control signals; and
synchronously latching a second half of the first plurality of bits in the first serial burst responsive to the second plurality of latch control signals.

3. The method of claim 1, wherein the predefined burst sequence is based on a column start address and burst length of the first serial burst.

4. The method of claim 1, further comprising simultaneously enabling column addresses associated with the first plurality of bits.

5. The method of claim 1, wherein outputting the bits to the global write and sense amplifier block includes outputting the number of bits associated with the first serial burst without accessing an entire memory page.

6. The method of claim 1, wherein the resistive type memory circuits include at least one of (a) a spin-transfer torque (STT) magnetoresistive random-access memory (MRAM) circuit, (b) an MRAM circuit, and (c) a resistive random-access memory (ReRAM).

7. A method for enabling higher data bandwidth in resistive type non-volatile random access memory circuits, the method comprising:
synchronously latching a first serial burst having a first plurality of bits;
storing the first plurality of bits in parallel to a first plurality of non-volatile memory cells;
receiving a second plurality of bits in parallel stored in a second plurality of non-volatile memory cells;
synchronously providing the second plurality of bits as a second serial burst;
in a back-to-back burst write operation, synchronously latching a third serial burst having a third plurality of bits while the first serial burst of bits is being stored to the first plurality of non-volatile memory cells; and
storing in parallel the third plurality of bits associated with the third serial burst to a third plurality of non-volatile memory cells.

8. The method of claim 7, further comprising:
latching in parallel, by a plurality of latches, the second plurality of bits from the second plurality of non-volatile memory cells;
rearranging, by a read switch, the order of the bits based on a predefined burst sequence by selecting one of the latched bits at a time from the plurality of latches based on the predefined burst sequence; and
outputting the rearranged bits as part of the second serial burst.

9. The method of claim 8, wherein the predefined burst sequence is based on a column start address and burst length of the second serial burst.

10. The method of claim 8, further comprising simultaneously enabling column addresses associated with the second plurality of bits.

11. The method of claim 8, wherein outputting the second serial burst includes outputting the number of bits associated with the second serial burst without accessing an entire memory page.

12. The method of claim 7, further comprising:
extending a write pulse associated with the third plurality of bits by a predetermined number of clock cycles.

13. The method of claim 12, wherein:
the predetermined number of clock cycles is equal to or greater than the burst length for single data rate (SDR) operation; and
the predetermined number of clock cycles is equal to or greater than the burst length divided by 2 for double data rate (DDR) operation.

14. The method of claim 7, wherein the resistive type memory circuits include at least one of (a) a spin-transfer torque (STT) magnetoresistive random-access memory (MRAM) circuit, (b) an MRAM circuit, and (c) a resistive random-access memory (ReRAM).

15. A method for enabling higher data bandwidth in resistive type non-volatile random access memory circuits, the method comprising:
synchronously latching a first serial burst having a first plurality of bits;
storing the first plurality of bits in parallel to a first plurality of non-volatile memory cells;
receiving a second plurality of bits in parallel stored in a second plurality of non-volatile memory cells;
synchronously providing the second plurality of bits as a second serial burst;

in a back-to-back burst read operation, receiving in parallel a fourth plurality of bits stored in a fourth plurality of non-volatile memory cells while the second serial burst of bits is being provided, wherein the fourth plurality of bits are associated with a fourth serial burst; and
synchronously providing the fourth plurality of bits as the fourth serial burst.

16. The method of claim 15, further comprising:
extending a read pulse associated with the fourth plurality of bits by a predetermined number of clock cycles.

17. The method of claim 16, wherein:
the predetermined number of clock cycles is equal to or greater than the burst length for single data rate (SDR) operation; and
the predetermined number of clock cycles is equal to or greater than the burst length divided by 2 for double data rate (DDR) operation.

18. The method of claim 15, wherein the resistive type memory circuits include at least one of (a) a spin-transfer torque (STT) magnetoresistive random-access memory (MRAM) circuit, (b) an MRAM circuit, and (c) a resistive random-access memory (ReRAM).

\* \* \* \* \*